United States Patent
Naruse

(10) Patent No.: US 8,521,229 B2
(45) Date of Patent: *Aug. 27, 2013

(54) CELLULAR TELEPHONE APPARATUS, CONTROL METHOD AND CELLULAR TELEPHONE SYSTEM

(75) Inventor: Naoki Naruse, Kawasaki (JP)

(73) Assignee: NTT DoCoMo, Inc., Tokyo (JP)

( * ) Notice: Subject to any disclaimer, the term of this patent is extended or adjusted under 35 U.S.C. 154(b) by 892 days.

This patent is subject to a terminal disclaimer.

(21) Appl. No.: 12/621,981

(22) Filed: Nov. 19, 2009

(65) Prior Publication Data

US 2010/0130260 A1 May 27, 2010

(30) Foreign Application Priority Data

Nov. 21, 2008 (JP) ................................ 2008-298019

(51) Int. Cl.
*H04M 1/00* (2006.01)

(52) U.S. Cl.
USPC ..................... 455/566; 455/343.1; 455/343.2; 455/343.3; 455/343.4; 455/343.5; 455/343.6; 455/572; 455/573; 455/574; 370/311

(58) Field of Classification Search
USPC ...... 455/566, 572–574, 343–343.6; 345/158; 370/311, 318
See application file for complete search history.

(56) References Cited

U.S. PATENT DOCUMENTS

| | | | |
|---|---|---|---|
| 2002/0001381 A1 | 1/2002 | Mori | |
| 2003/0083011 A1* | 5/2003 | Haller et al. | 455/41 |
| 2003/0139156 A1 | 7/2003 | Satoh et al. | |
| 2006/0135218 A1* | 6/2006 | Son et al. | 455/573 |
| 2006/0166705 A1 | 7/2006 | Seshadri et al. | |
| 2007/0135182 A1* | 6/2007 | Hanif et al. | 455/575.1 |
| 2007/0178838 A1* | 8/2007 | Matsuda | 455/41.2 |
| 2007/0236408 A1* | 10/2007 | Yamaguchi et al. | 345/1.1 |
| 2007/0276523 A1 | 11/2007 | Alley | |

FOREIGN PATENT DOCUMENTS

| | | |
|---|---|---|
| JP | 2003209603 A | 7/2003 |
| JP | 2004120056 A | 4/2004 |
| JP | 3539326 B2 | 7/2004 |
| JP | 2006-013663 A | 1/2006 |
| JP | 200736356 A | 2/2007 |
| JP | 2007-165960 A | 6/2007 |
| WO | 03039023 A1 | 5/2003 |

(Continued)

OTHER PUBLICATIONS

Extended European Search Report dated Mar. 18, 2010, issued on the corresponding European Patent Application No. 09176482.9.

(Continued)

*Primary Examiner* — Kamran Afshar
*Assistant Examiner* — Shahriar Behnamian
(74) *Attorney, Agent, or Firm* — MKG, LLC

(57) ABSTRACT

In a cellular telephone apparatus a sub-terminal constitutes a part of the cellular telephone apparatus and is separable from a main terminal constituting the apparatus body. Each of the sub-terminal and the main terminal has a battery section, provided are battery remaining amount detecting sections, battery remaining amount notifying sections, table holding sections that hold operation tables that define operations of devices that the main terminal and sub-terminal have corresponding to the battery remaining amounts of the main terminal and sub-terminal. Control sections are provided that determine the operations of devices available based on battery remaining amount.

11 Claims, 12 Drawing Sheets

(56) References Cited

FOREIGN PATENT DOCUMENTS

| | | |
|---|---|---|
| WO | 2006059863 A1 | 6/2006 |
| WO | 2007004582 A1 | 1/2007 |
| WO | 2008130456 A1 | 10/2008 |

OTHER PUBLICATIONS

Office Action with English Translation, Dated Mar. 21, 2012, issued in conjunction with Japanese Patent Application No. 2008-298019.

* cited by examiner

| MAIN TERMINAL \ SUB-TERMINAL | BATTERY REMAINING AMOUNT (LARGE) | BATTERY REMAINING AMOUNT (MIDDLE) | BATTERY REMAINING AMOUNT (SMALL) | LOW VOLTAGE STATE | POWER OFF STATE |
|---|---|---|---|---|---|
| BATTERY REMAINING AMOUNT (LARGE) | NORMAL DISPLAY | NORMAL DISPLAY | NORMAL DISPLAY | DISPLAY OF LOW VOLTAGE ON THE SUB-TERMINAL SIDE | DISPLAY OF OFF STATE |
| BATTERY REMAINING AMOUNT (MIDDLE) | NORMAL DISPLAY | NORMAL DISPLAY | NORMAL DISPLAY | DISPLAY OF LOW VOLTAGE ON THE SUB-TERMINAL SIDE | DISPLAY OF OFF STATE |
| BATTERY REMAINING AMOUNT (SMALL) | NORMAL DISPLAY | NORMAL DISPLAY | NORMAL DISPLAY | DISPLAY OF LOW VOLTAGE ON THE SUB-TERMINAL SIDE | DISPLAY OF OFF STATE |
| LOW VOLTAGE STATE | DISPLAY OF LOW VOLTAGE ON THE MAIN TERMINAL SIDE | DISPLAY OF LOW VOLTAGE ON THE MAIN TERMINAL SIDE | DISPLAY OF LOW VOLTAGE ON THE MAIN TERMINAL SIDE | DISPLAY OF LOW VOLTAGE OF THE MAIN TERMINAL/ SUB-TERMINAL | DISPLAY OF OFF STATE |
| POWER OFF STATE | DISPLAY OF OFF STATE | DISPLAY OF OFF STATE | DISPLAY OF OFF STATE | DISPLAY OF OFF STATE | NON-OPERATION |

FIG. 4

| SUB-TERMINAL / MAIN TERMINAL | BATTERY REMAINING AMOUNT (LARGE) | BATTERY REMAINING AMOUNT (MIDDLE) | BATTERY REMAINING AMOUNT (SMALL) | LOW VOLTAGE STATE | POWER OFF STATE |
|---|---|---|---|---|---|
| BATTERY REMAINING AMOUNT (LARGE) | DO NOT PERFORM CHARGE OPERATION | DO NOT PERFORM CHARGE OPERATION | START CHARGING FROM THE MAIN TERMINAL TO SUB-TERMINAL | START CHARGING FROM THE MAIN TERMINAL TO SUB-TERMINAL | START CHARGING FROM THE MAIN TERMINAL TO SUB-TERMINAL |
| BATTERY REMAINING AMOUNT (MIDDLE) | DO NOT PERFORM CHARGE OPERATION | DO NOT PERFORM CHARGE OPERATION | START CHARGING FROM THE MAIN TERMINAL TO SUB-TERMINAL | START CHARGING FROM THE MAIN TERMINAL TO SUB-TERMINAL | START CHARGING FROM THE MAIN TERMINAL TO SUB-TERMINAL |
| BATTERY REMAINING AMOUNT (SMALL) | START CHARGING FROM THE SUB-TERMINAL TO MAIN TERMINAL | START CHARGING FROM THE SUB-TERMINAL TO MAIN TERMINAL | DO NOT PERFORM CHARGE OPERATION | DO NOT PERFORM CHARGE OPERATION | DO NOT PERFORM CHARGE OPERATION |
| LOW VOLTAGE STATE | START CHARGING FROM THE SUB-TERMINAL TO MAIN TERMINAL | START CHARGING FROM THE SUB-TERMINAL TO MAIN TERMINAL | DO NOT PERFORM CHARGE OPERATION | DO NOT PERFORM CHARGE OPERATION | DO NOT PERFORM CHARGE OPERATION |
| POWER OFF STATE | START CHARGING FROM THE SUB-TERMINAL TO MAIN TERMINAL | START CHARGING FROM THE SUB-TERMINAL TO MAIN TERMINAL | DO NOT PERFORM CHARGE OPERATION | DO NOT PERFORM CHARGE OPERATION | DO NOT PERFORM CHARGE OPERATION |

FIG. 5

| OPERATING FUNCTION \ DEVICE | VOICE CALLING FUNCTION | | E-MAIL PROCESSING FUNCTION | | VIDEOPHONE FUNCTION | | i-MODE FUNCTION |
|---|---|---|---|---|---|---|---|
| | CALLING | RECEIVING | CALLING | RECEIVING | CALLING | RECEIVING | |
| SUB-DISPLAY | DISPLAY (CALLING NUMBER) | DISPLAY (INCOMING-CALL NUMBER) | DISPLAY (TRANSMISSION IS NOT ALLOWED MSG) | DISPLAY (DISPLAY THE NUMBER OF RECEIVED E-MAILS) | DISPLAY (VIDEOPHONE IS NOT ALLOWED MSG) | DISPLAY (VIDEOPHONE IS NOT ALLOWED MSG) | DISPLAY (i-MODE TRANSMIT IS NOT ALLOWED MSG) |
| OPERATING KEY | OPERATION IS ALLOWED | OPERATION IS ALLOWED | OPERATION IS ALLOWED | OPERATION IS ALLOWED | OPERATION IS ALLOWED | OPERATION IS ALLOWED | OPERATION IS ALLOWED |
| RECEIVER | ON | ON | OFF | OFF | OFF | OFF | OFF |
| MICROPHONE | ON | ON | OFF | OFF | OFF | OFF | OFF |

FIG. 8

| DEVICE \ OPERATING FUNCTION | VOICE CALLING FUNCTION | | E-MAIL PROCESSING FUNCTION | | VIDEOPHONE FUNCTION | | i-MODE FUNCTION |
|---|---|---|---|---|---|---|---|
| | CALLING | RECEIVING | CALLING | RECEIVING | CALLING | RECEIVING | |
| MAIN DISPLAY | DISPLAY (CALLING IS NOT ALLOWED MSG) | — | DISPLAY (E-MAIL IS NOT ALLOWED MSG) | — | DISPLAY (VIDEOPHONE IS NOT ALLOWED MSG) | — | DISPLAY (i-MODE TRANSMIT IS NOT ALLOWED MSG) |
| TOUCH PANEL | OPERATION IS ALLOWED | — | OPERATION IS ALLOWED | — | OPERATION IS ALLOWED | — | OPERATION IS ALLOWED |
| RECEIVER | OFF | — | OFF | — | OFF | — | OFF |
| MICROPHONE | OFF | — | OFF | — | OFF | — | OFF |

FIG. 9

CELLULAR TELEPHONE APPARATUS, CONTROL METHOD AND CELLULAR TELEPHONE SYSTEM

CROSS-REFERENCE TO RELATED APPLICATION

The present disclosure relates to subject matter contained in Japanese Patent Application No. 2008-298019 filed on Nov. 21, 2008, which are expressly incorporated herein by reference in its entireties.

FIELD OF THE INVENTION

The present invention relates to a cellular telephone apparatus, control method and cellular telephone system, and more particularly, to a cellular telephone apparatus provided with a part separable from the cellular telephone apparatus, control method and cellular telephone system.

BACKGROUND OF THE INVENTION

Conventionally, to enhance convenience in using the videophone function, a cellular telephone apparatus is proposed wherein an imaging/display unit constituting a part of the cellular telephone apparatus is provided and is separable from a calling unit constituting the main body of the cellular telephone apparatus (for example, JP 2004-120056). In this cellular telephone apparatus, the imaging/display unit and calling unit are both provided with batteries, and each of the units is thus configured to be able to operate without receiving power supply from the outside.

Meanwhile, cellular telephone apparatuses have currently been installed with various functions, and in the partially separable cellular telephone apparatus as described above, it is considered that the function usable in each unit exists separately (for example, the voice calling function only is present in the calling unit as described above). Then, when such a function is used frequently, an event may occur that the battery of one of the units is exhausted excessively. In this case, it can be considered that some function becomes unavailable with the imaging/display unit connected to the calling unit, etc. and that it is made difficult to ensure the stable operation of the cellular telephone apparatus.

SUMMARY OF THE INVENTION

It is an object of the present invention to provide a cellular telephone apparatus, control method and cellular telephone system enabling a part of the cellular telephone apparatus to be used separately, while ensuring the stable operation of the cellular telephone apparatus.

A cellular telephone apparatus of the invention is a cellular telephone apparatus in which a first apparatus constituting a part of the cellular telephone apparatus is provided to be separable from a second apparatus constituting an apparatus body, and each of the first apparatus and the second apparatus is provided with a battery section, and has a battery remaining amount detecting section that detects a battery remaining amount of each of the first apparatus and the second apparatus, a battery remaining amount notifying section that notifies the apparatus on the other side of the battery remaining amount detected in the battery remaining amount detecting section, a table holding section that holds an operation table that defines operations of devices that the first apparatus and the second apparatus have corresponding to the battery remaining amount of each of the first apparatus and the second apparatus, and a control section that determines the operations of devices that the first apparatus and the second apparatus have based on the battery remaining amount of the apparatus on the other side notified in the battery remaining amount notifying section and descriptions of the operation table held in the table holding section.

According to this constitution, since the operations of devices that the first apparatus and the second apparatus have are determined based on the battery remaining amount of the apparatus on the other side and descriptions of the operation table, even when the cellular telephone apparatus has a separable structure, it is possible to select the operations of devices that the first apparatus and the second apparatus have corresponding to the battery remaining amount of the apparatus on the other side. By this means, for example, when the battery remaining amount is small in one of the apparatuses, since it is made possible that the other apparatus informs of the small remaining amount, and that the other apparatus charges the battery section of another apparatus, it is possible to prevent the occurrence of an unforeseen situation for the user such that the function installed in the cellular telephone apparatus cannot be used, and it is possible to separate a part of the cellular telephone apparatus to use while ensuring the stable operation in the cellular telephone apparatus.

For example, in the cellular telephone apparatus of the invention, the control section determines operations of devices that the first apparatus has according to the battery remaining amount of the first apparatus detected in the battery remaining amount detecting section, the battery remaining amount of the second apparatus notified in the battery remaining amount notifying section, and the descriptions of the operation table held in the table holding section. In this case, the operations of devices that the first apparatus has are determined according to the battery remaining amount of the first apparatus, the battery remaining amount of the second apparatus, and the descriptions of the operation table. Therefore, for example, when the battery remaining amount is small in the second apparatus, since it is made possible that the first apparatus informs of the small remaining amount, and that the first apparatus charges the battery section of the second apparatus, it is possible to prevent the occurrence of an unforeseen situation for the user such that the function installed in the cellular telephone apparatus cannot be used, and it is possible to guarantee the stable operation in the cellular telephone apparatus.

Further, in the cellular telephone apparatus of the invention, the control section determines operations of devices that the second apparatus has according to the battery remaining amount of the second apparatus detected in the battery remaining amount detecting section, the battery remaining amount of the first apparatus notified in the battery remaining amount notifying section, and the descriptions of the operation table held in the table holding section. In this case, the operations of devices that the second apparatus has are determined according to the battery remaining amount of the first apparatus, the battery remaining amount of the second apparatus, and the descriptions of the operation table. Therefore, for example, when the battery remaining amount is small in the first apparatus, since it is made possible that the second apparatus informs of the small remaining amount, and that the second apparatus charges the battery section of the first apparatus, it is possible to prevent the occurrence of an unforeseen situation for the user such that the function installed in the cellular telephone apparatus cannot be used, and it is possible to guarantee the stable operation in the cellular telephone apparatus.

In the cellular telephone apparatus of the invention, a display section that displays the battery remaining amount of each of the first apparatus and the second apparatus is provided as a device of each of the first apparatus and the second apparatus, respectively, the table holding section holds as the operation table a display operation table that defines display contents in the display section corresponding to the battery remaining amount of each of the first apparatus and the second apparatus, and when the battery remaining amount detecting section detects a change in the battery remaining amount of at least one of the first apparatus and the second apparatus, the control section preferably determines the battery remaining amount of each of the first apparatus and the second apparatus to be displayed in the display section corresponding to the battery remaining amount of each of the first apparatus and the second apparatus detected in the battery remaining amount detecting section, the battery remaining amount of the other on the other side notified in the battery remaining amount notifying section, and descriptions of the display operation table. In this case, when a change in the battery remaining amount is detected in at least one of the first apparatus and the second apparatus, since the battery remaining amount of each of the first apparatus and the second apparatus to be displayed in the display section is determined corresponding to the battery remaining amount of each of the first apparatus and the second apparatus, the notified battery remaining amount of the other apparatus, and descriptions of the display operation table, the latest battery remaining amount of each of the first apparatus and the second apparatus can always be displayed, and it is thus possible to inform the user of the latest battery remaining amount status in each apparatus.

Particularly, in the cellular telephone apparatus of the invention, it is preferable to define a display content to inform of imminent battery exhaustion in the display operation table before the battery remaining amount is exhausted in at least one of the first apparatus and the second apparatus and the power is turned off. In this case, it is possible to inform the user of imminent battery exhaustion before the power is turned off in at least one of the first apparatus and the second apparatus, and it is thereby possible to urge the user to execute processing such as charge operation and the like.

Further, in the cellular telephone apparatus of the invention, a charging section that charges the battery section of the apparatus on the other side is provided as a device of each of the first apparatus and the second apparatus, the table holding section holds as the operation table a charge operation table that defines whether or not the charging section performs charge operation corresponding to the battery remaining amount of each of the first apparatus and the second apparatus, and the control section preferably determines whether or not the charging section performs charge operation corresponding to the battery remaining amount of each of the first apparatus and the second apparatus detected in the battery remaining amount detecting section, the battery remaining amount of the apparatus on the other side notified in the battery remaining amount notifying section, and descriptions of the charge operation table. In this case, since whether or not to perform the charge operation is determined corresponding to the battery remaining amount of each of the first apparatus and the second apparatus, the notified battery remaining amount of the other apparatus, and descriptions of the charge operation table, for example, when the battery remaining amount is small in one of the apparatuses, the other apparatus is able to charge the battery section of the one of the apparatuses.

Furthermore, in the cellular telephone apparatus of the invention, it is preferable that the table holding section holds as the operation table a device operation table that defines devices to be driven on the apparatus on the other side when the power is turned off in one of the first apparatus and the second apparatus, and that the control section determines a device to be driven corresponding to descriptions of the device operation table when the battery remaining amount detecting section detects that the power is turned off in one of the first apparatus and the second apparatus. In this case, when it is detected that the power is turned off in one of the first apparatus and the second apparatus, since a device to be driven is determined corresponding to the descriptions of the device operation table, for example, it is possible to reserve execution of functions usable in one of the apparatuses, and inform the user that a specific function cannot be used due to power off of one of the apparatuses.

Particularly, in the cellular telephone apparatus of the invention, it is preferable to define devices to be driven in the device operation table corresponding to functions operating in the first apparatus or the second apparatus. In this case, a device to be driven can be selected corresponding to the functions operating in the first apparatus or the second apparatus, and it is thereby possible to drive required devices as appropriate corresponding to the functions.

A control method of a cellular telephone apparatus of the invention is a control method of a cellular telephone apparatus in which a first apparatus constituting a part of the cellular telephone apparatus is provided to be separable from a second apparatus constituting an apparatus body, and each of the first apparatus and the second apparatus is provided with a battery section, and has the steps of detecting a battery remaining amount of each of the first apparatus and the second apparatus, notifying the apparatus on the other side of the detected battery remaining amount, and determining operations of devices that the first apparatus and the second apparatus have based on descriptions of an operation table that defines the operations of devices that the first apparatus and the second apparatus have corresponding to the notified battery remaining amount of the apparatus on the other side, and the battery remaining amount of each of the first apparatus and the second apparatus.

According to this method, since the operations of devices that the first apparatus and the second apparatus have are determined based on the battery remaining amount of the other apparatus and descriptions of the operation table, even when the cellular telephone apparatus has a separable structure, it is possible to select the operations of devices that the first apparatus and the second apparatus have corresponding to the battery remaining amount of the other apparatus. By this means, for example, when the battery remaining amount is small in one of the apparatuses, since it is made possible that the other apparatus informs of the small remaining amount, and that the other apparatus charges the battery section of the one of the apparatuses, it is possible to prevent the occurrence of an unforeseen situation for the user such that the function installed in the cellular telephone apparatus cannot be used, and it is possible to separate a part of the cellular telephone apparatus to use while ensuring the stable operation in the cellular telephone apparatus.

A cellular telephone system of the invention is a cellular telephone system having a first unit installed with part of functions of a cellular telephone apparatus, and a second unit provided with the first unit to be separable with each of the first unit and the second unit provided with a battery section, where the first unit has a first battery remaining amount detecting section that detects a battery remaining amount of the first unit, a first battery remaining amount notifying section that notifies the second unit of the battery remaining amount detected in the first battery remaining amount detecting section, a first table holding section that holds a first operation table that defines operations of devices that the first unit has corresponding to the battery remaining amount of each of the first unit and the second unit, and a first control section that determines the operations of devices that the first unit has based on the battery remaining amount of the second unit notified from the second unit and descriptions of the first operation table held in the first table holding section, and the second unit has a second battery remaining amount detecting section that detects a battery remaining amount of the second unit, a second battery remaining amount notifying section that notifies the first unit of the battery remaining amount detected in the second battery remaining amount detecting section, a second table holding section that holds a second operation table that defines operations of devices that the second unit has corresponding to the battery remaining amount of each of the first unit and the second unit, and a second control section that determines the operations of devices that the second unit has based on the battery remaining amount of the first unit notified from the first unit and descriptions of the second operation table held in the second table holding section.

According to this constitution, since the operations of devices that the first unit and the second unit have are determined based on the battery remaining amount of the other unit and descriptions of the operation table, even when the cellular telephone system has a separable structure, it is possible to select the operations of devices that the first unit and the second unit have corresponding to the battery remaining amount of the other unit. By this means, for example, when the battery remaining amount is small in one of the units, since it is made possible that the other unit informs of the small remaining amount, and that the other unit charges the battery section of the one of the unit, it is possible to prevent the occurrence of an unforeseen situation for the user such that the function installed in the cellular telephone system cannot be used, and it is possible to separate a part of the cellular telephone system to use while ensuring the stable operation in the cellular telephone system.

BRIEF DESCRIPTION OF THE DRAWINGS

The various features of novelty which characterize the invention are pointed out with particularity in the claims attached to and forming a part of this specification. For a better understanding of the invention, its operating advantages, and specific objects attained by its use, reference should be had to the accompanying drawings and descriptive matter.

FIG. 4 is a diagram to explain descriptions registered with a display operation table held in a table holding section of the main terminal in the cellular telephone;

FIG. 5 is a diagram to explain descriptions registered with a charge operation table held in the table holding section of the main terminal in the cellular telephone;

FIG. 8 is a diagram to explain descriptions registered with a main-terminal device operation table held in the table holding section of the main terminal in the cellular telephone according to the embodiment;

FIG. 9 is a diagram to explain descriptions registered with a sub-terminal device operation table held in a table holding section of the sub-terminal in the cellular telephone;

DESCRIPTION OF THE PREFERRED EMBODIMENTS

In the following description, the case is described that the present invention is embodied using a cellular telephone apparatus (hereinafter, simply referred to as a "cellular telephone") 1, but the invention is not limited thereto, and is achieved also as a control method of the cellular telephone 1, and a cellular telephone system having a first unit 1 installed with part of functions of the cellular telephone apparatus, and a second unit provided with the first unit to be separable.

Figure 1:
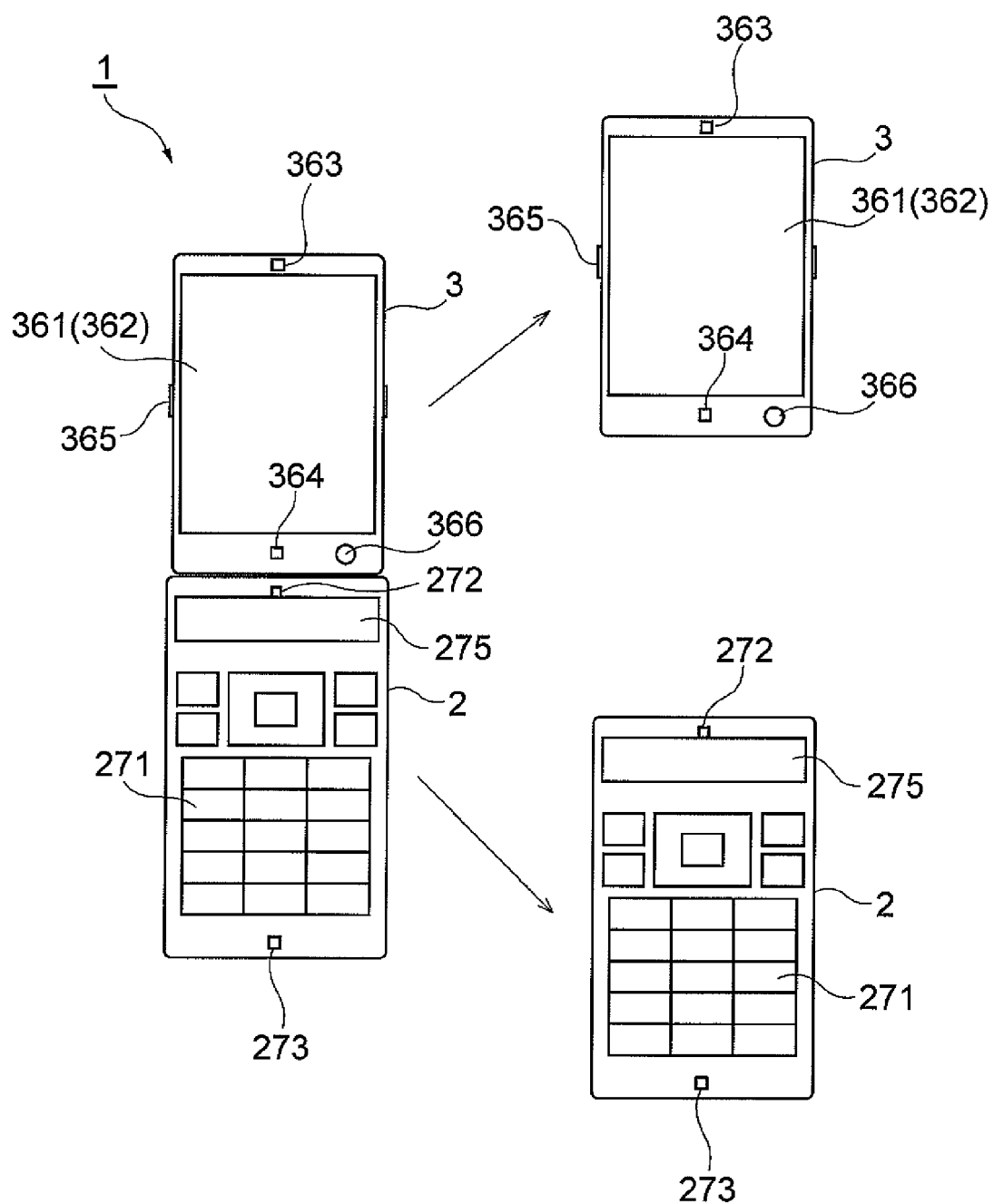
FIG. 1 is a diagram showing a cellular telephone according to one embodiment of the invention.

FIG. 1 is a diagram showing a cellular telephone apparatus 1 according to one embodiment of the invention. As shown in FIG. 1, the cellular telephone 1 according to this embodiment is comprised of a main terminal 2 formed of an apparatus (second apparatus) installed with main functions of the cellular telephone 1, and a sub-terminal 3 formed of an apparatus (first apparatus) installed with part of functions of the cellular telephone 1. The sub-terminal 3 is provided to be separable from the main terminal 2, and is configured to execute part of functions (for example, e-mail check function, music player function, and one-segment broadcasting reception function (hereinafter, referred to as "One Seg function" as appropriate)) of the cellular telephone 1 by only the sub-terminal 3 by performing near field radio communication, described later, with the main terminal 2. In addition, the main terminal 2 and sub-terminal 3 are provided to be connectable in a predetermined portion by a magnet, and are capable of being used as a common one-piece cellular telephone in the connected state.

For example, such a separable type cellular telephone 1 is suitable for a usage mode where the user puts the main terminal 2 into a bag, etc, always wears the sub-terminal 3 as a media player of music and pictures, and only when needing a complicated operation, takes the main terminal 2 out of the bag to operate from the main terminal 2 side. Further, for example, when the user watches one-segment broadcasting in a bath or the like hard to receive radio signals, the cellular telephone 1 is suitable for another usage mode where the user places the main terminal 2 in a position near the window easy to receive radio signals, brings only the sub-terminal 3 to the bath, and receives one-segment broadcasting data from the main terminal 2 to watch. This embodiment is to ensure the stable operation of the cellular telephone 1 in a state where the main terminal 2 and sub-terminal 3 are separated (hereinafter, referred to as a "separate state" as appropriate) and in another state where the main terminal 2 and sub-terminal 3 are connected (hereinafter, referred to as a "connected state" as appropriate).

Figure 2:
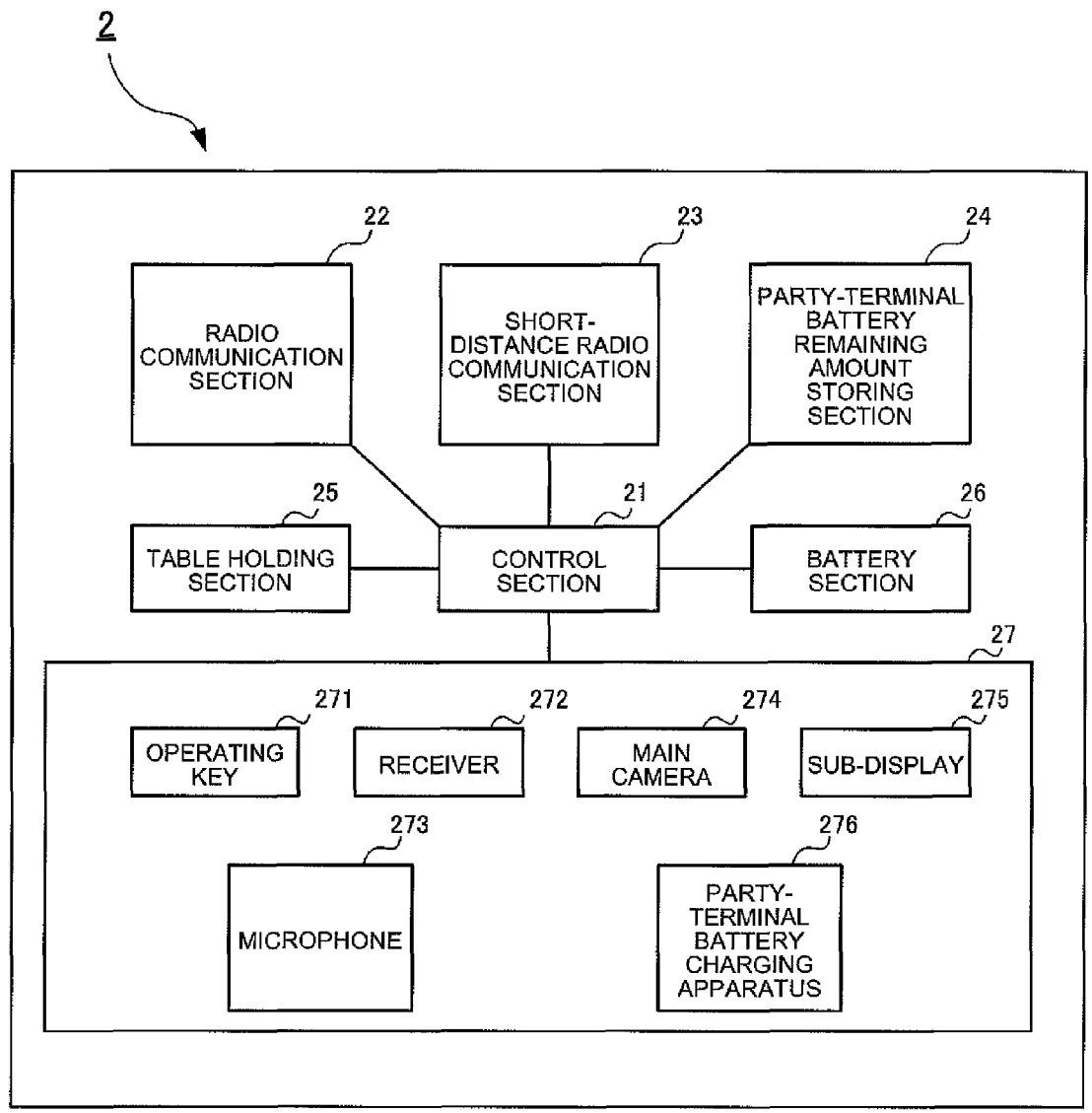
FIG. 2 is a block diagram illustrating a configuration of a main terminal in the cellular telephone.
Figure 3:
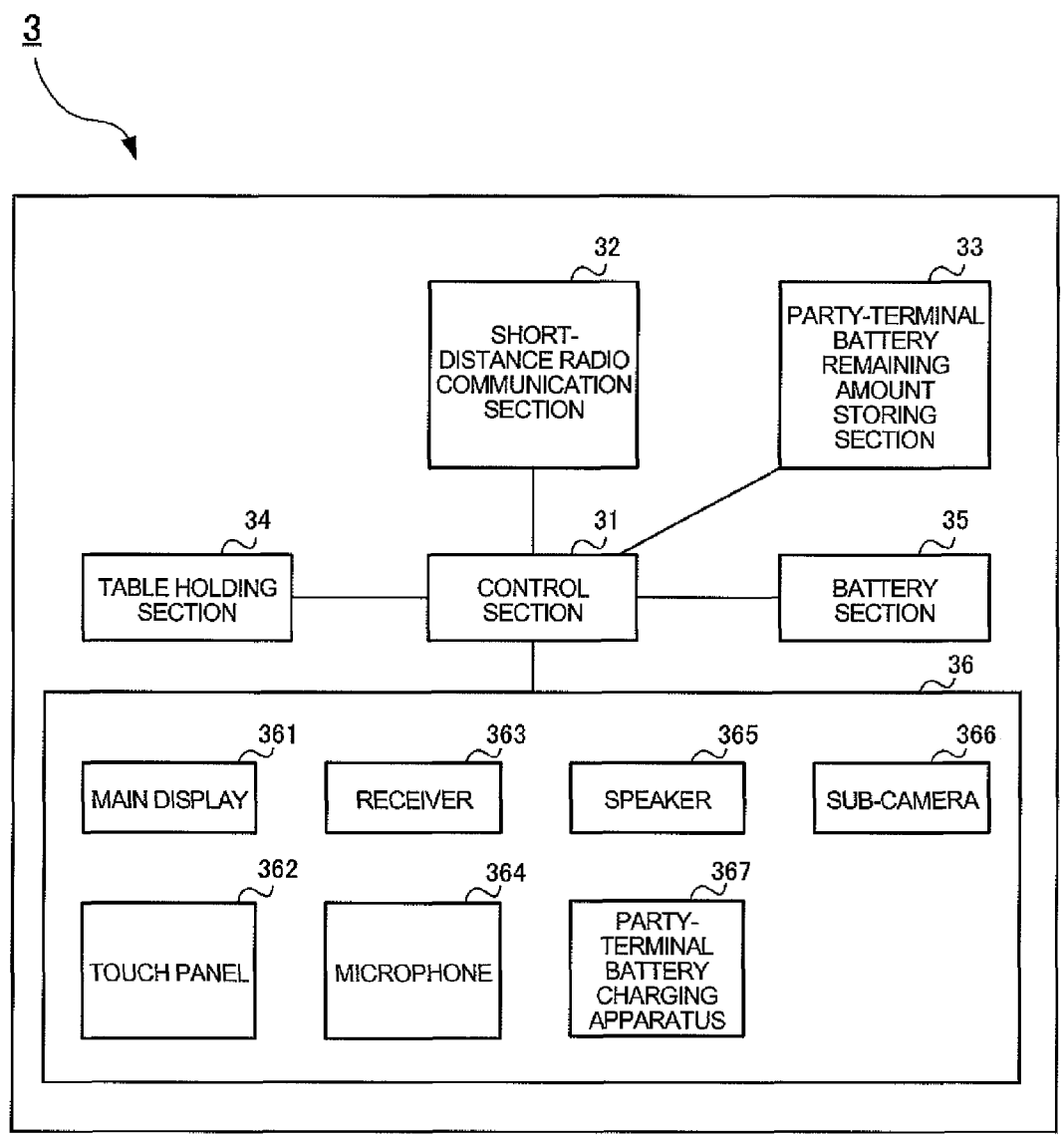
FIG. 3 is a block diagram illustrating a configuration of a sub-terminal in the cellular telephone.

Configurations of the main terminal 2 and sub-terminal 3 that the cellular telephone 1 has will be described below using FIGS. 2 and 3 while referring to the cellular telephone 1 as shown in FIG. 1. FIGS. 2 and 3 are block diagrams respectively illustrating configurations of the main terminal 2 and sub-terminal 3 that the cellular telephone 1 according to this embodiment has. In addition, the configurations of the cellular telephone 1 as shown in FIGS. 2 and 3 are simplified to describe the invention, and are assumed to have components that the common cellular telephone 1 has.

As shown in FIG. 2, the main terminal 2 that the cellular telephone 1 according to this embodiment has is comprised of a control section 21 that controls the entire main terminal 2, and a radio communication section 22, short-distance radio communication section 23, party-terminal battery remaining amount storing section 24, table holding section 25, battery section 26 and device group 27 each connected to the control section 21. Then, the device group 27 installed in the main terminal 2 includes an operating key 271, receiver 272, microphone 273, main camera 274, sub-display 275 and party-terminal battery charging apparatus 276.

The radio communication section 22 performs radio communication with a base station apparatus installed onto a mobile communication network via an antenna apparatus not shown. For example, the radio communication section 22 transmits speech data and packet data from the cellular telephone 1 to the base station apparatus via the mobile communication network in performing speech communication and packet communication with another cellular telephone or the like, while receiving speech data and packet data from the communicating party from the base station apparatus via the mobile communication network.

The short-distance radio communication section 23 performs short-distance radio communication with the sub-terminal 3 via the antenna apparatus not shown. In this embodiment, the short-distance radio communication section 23 performs Bluetooth communication, and transmits speech data and image data to the sub-terminal 3, while receiving requests for various kinds of processing and the like sent from the sub-terminal 3. Particularly, the short-distance radio communication section 23 functions as a battery remaining amount notifying section together with the control section 21, and performs transmission and reception of battery remaining amount display change notification with the sub-terminal 3 as described later. In addition, this embodiment shows the case of using Bluetooth in radio communication between the main terminal 2 and sub-terminal 3, but the communication technique used in radio communication between the terminals 2 and 3 is not limited thereto, and is capable of being modified as appropriate. For example, IrDA (Infrared Data Association) using infrared rays may be applied.

The party-terminal battery remaining amount storing section 24 stores a battery remaining amount of the party-terminal i.e. sub-terminal 3 notified by party-terminal battery remaining amount display notification received from the sub-terminal 3. The battery remaining amount of the sub-terminal 3 stored in the party-terminal battery remaining amount storing section 24 is referred to when instructions are given to a device installed in the main terminal 2.

The table holding section 25 holds a table that defines an operation executed by each device of the main terminal 2 corresponding to the battery remaining amounts of the main terminal 2 and sub-terminal 3. For example, the table holding section 25 holds a display operation table that defines descriptions displayed in the sub-display 275 corresponding to the battery remaining amounts of the main terminal 2 and sub-terminal 3, a charge operation table that defines the presence or absence of charge operation executed by the party-terminal battery charging apparatus 276 corresponding to the battery remaining amounts of the main terminal 2 and sub-terminal 3, and a main-terminal device operation table that defines devices on the main terminal 2 side driven in each function installed in the cellular telephone 1 corresponding to the battery remaining amounts of the main terminal 2 and sub-terminal 3. In addition, details of descriptions registered with these display operation table, charge operation table and main-terminal device operation table will be described later.

The battery section 26 is a portion that supplies power required for the main terminal 2 to operate. The battery section 26 is provided to be detachable from a battery storage section provided in the main terminal 2, and is configured to be capable of being charged by a charger not shown. The main terminal 2 is designed to be able to operate for a predetermined time corresponding to driving conditions of various devices and radio communication conditions when the battery section 26 is charged without receiving power supply from the outside with the main terminal 2 being independent or with the main terminal 2 connected to the sub-terminal 3.

The operating key 271 constituting a part of the device group 27 receives an operation from the user, and is comprised of a numeric keypad for receiving inputs of numerical and text, direction key for moving a cursor displayed on a main display 361 of the sub-terminal 3 described later, a determination key for selecting information specified by movement of the cursor, and function keys associated with specific functions.

The receiver 272 is a portion mainly constituting a call receiving section, and outputs a voice of a communicating party in using the voice calling function and videophone function with the sub-terminal 3 separated. Further, the receiver 272 outputs speech data in one-segment broadcasting when the One Seg function is used with the sub-terminal 3 separated.

The microphone 273 is a portion mainly constituting a call transmitting section, and receives user's voice in using the voice calling function and videophone function irrespective of the state of the sub-terminal 3 (in other words, irrespective of whether the sub-terminal 3 is in the connected state or separate state). In addition, the sensitivity of the microphone 273 in using the videophone function is higher than the sensitivity in using the voice calling function.

The main camera 274 is used as a main image pickup device in using the camera function. In addition, this main camera 274 is provided on the back of the main terminal 2 and does not appear in the main terminal 2 as shown in FIG. 1.

The sub-display 275 functions as a display section, and displays information corresponding to the operation state of the main terminal 2. For example, the sub-display 275 displays a calling number and incoming-call number in using the voice calling function by the main terminal 2 alone. Further, the sub-display 275 displays the battery remaining amounts of the battery section 26 and battery section 35 respectively of the main terminal 2 and sub-terminal 3 when the battery remaining amount of the battery section 35 of the sub-terminal 3 described later is small. In addition, in this embodiment, it is configured to display the battery remaining amounts of the battery section 26 and battery section 35 respectively of the main terminal 2 and sub-terminal 3 only when the battery remaining amount of the battery section 35 of the sub-terminal 3 becomes small, but the battery remaining amounts of the battery section 26 and battery section 35 respectively of the main terminal 2 and sub-terminal 3 may be displayed irrespective of the battery remaining amount of the battery section 35 of the sub-terminal 3.

The party-terminal battery charging apparatus 276 functions as a charging section, and performs charge operation to charge the party-terminal i.e. battery section 35 of the sub-terminal 3 described later. For example, the party-terminal battery charging apparatus 276 performs the charge operation on the battery section 35 of the sub-terminal 3 connected to the terminal 2 via a contact terminal, not shown, using the remaining battery of the battery section 26. In addition, charging the battery section 35 of the sub-terminal 3 is not limited to such a case of performing via the contact terminal, and may be performed in a non-contact aspect.

The control section 21 controls these components. Particularly, the control section 21 determines the operation of each device installed in the main terminal 2 according to descriptions of the display operation table, charge operation table and main-terminal device operation table held in the table holding section 25 based on the battery remaining amount of the battery section 26 of the main terminal 2 and the battery remaining amount of the battery section 35 of the sub-terminal 3. Further, as described specifically later, the control section 21 functions as a battery remaining amount detecting section that detects the battery remaining amount of the battery section 26 of the main terminal 2.

Meanwhile, as shown in FIG. 3, the sub-terminal 3 that the cellular telephone 1 according to this embodiment has is comprised of a control section 31 that controls the entire sub-terminal 3, and a short-distance radio communication section 32, party-terminal battery remaining amount storing section 33, table holding section 34, battery section 35 and device group 36 each connected to the control section 31. Then, the device group 36 installed in the sub-terminal 3 includes a main display (hereinafter, simply referred to as a "display") 361, touch panel 362, receiver 363, microphone 364, speaker 365, sub-camera 366, and party-terminal battery charging apparatus 367.

The short-distance radio communication section 32 performs short-distance radio communication with the main terminal 2 via an antenna apparatus not shown. In this embodiment, the short-distance radio communication section 32 performs Bluetooth communication as in the short-distance radio communication section 23 on the main terminal 2 side, and receives speech data and image data from the main terminal 2, while transmitting requests for various kinds of processing and the like to the main terminal 2. Particularly, the short-distance radio communication section 32 functions as a battery remaining amount notifying section together with the control section 31, and performs transmission and reception of battery remaining amount display change notification with the main terminal 2 as described later.

The party-terminal battery remaining amount storing section 33 stores a battery remaining amount of the party-terminal i.e. main terminal 2 notified by party-terminal battery remaining amount display notification received from the main terminal 2. The battery remaining amount of the main terminal 2 stored in the party-terminal battery remaining amount storing section 33 is referred to when instructions are given to a device installed in the sub-terminal 3.

The table holding section 34 holds a table that defines an operation executed by each device of the sub-terminal 3 corresponding to the battery remaining amounts of the sub-terminal 3 and main terminal 2. For example, the table holding section 34 holds a display operation table that defines descriptions displayed in the display 361 corresponding to the battery remaining amounts of the sub-terminal 3 and main terminal 2, a charge operation table that defines the presence or absence of charge operation executed by the party-terminal battery charging apparatus 367 corresponding to the battery remaining amounts of the sub-terminal 3 and main terminal 2, and a sub-terminal device operation table that defines devices on the sub-terminal 3 side driven in each function installed in the cellular telephone 1 corresponding to the battery remaining amounts of the sub-terminal 3 and main terminal 2. In addition, details of descriptions registered with these display operation table, charge operation table and sub-terminal device operation table will be described later.

The battery section 35 is a portion that supplies power required for the sub-terminal 3 to operate. The battery section 35 is provided to be detachable from a battery storage section provided in the sub-terminal 3, and is configured to be capable of being charged by a charger not shown. The sub-terminal 3 is designed to be able to operate for a predetermined time corresponding to driving conditions of various devices and short-distance radio communication conditions when the battery section 35 is charged without receiving power supply from the outside with the sub-terminal 3 being independent.

The display 361 constituting a part of the device group 36 functions a display section, and displays screen data and picture data used in various functions operating in the cellular telephone 1. For example, when the voice calling function operates, the display 361 displays a screen (in-progress call screen) indicative of a call being in progress, and when the e-mail processing function operates, the display 361 displays a screen (e-mail screen) enabling the user to check and create an e-mail, etc. Further, when the videophone function operates, for example, the display 361 displays a face image of the communicating party, and when the One Seg function operates, the display 361 displays picture data in one-segment broadcasting. Furthermore, the display 361 displays an operation screen (for example, menu screen) corresponding to an input area of the touch panel 362 described later when the touch panel 362 receives an operation of the user. Moreover, the display 361 displays the battery remaining amounts of the battery section 26 and battery section 35 of the main terminal 2 and sub-terminal 3, respectively. As distinct from display in the sub-display 275 of the main terminal 2, in principle, the display 361 always displays the battery remaining amounts of the battery section 26 and battery section 35 of the main terminal 2 and sub-terminal 3, respectively.

The touch panel 362 is disposed in the lower layer portion of the display 361, and is a portion constituting an operation section when the sub-terminal 3 operates independently. In the touch panel 362 are formed input areas corresponding to the operation screen used in various functions operating in the cellular telephone 1, and it is possible to receive a user desired input operation. For example, when the user uses the e-mail processing function using the sub-terminal 3 alone, formed are input areas corresponding to an e-mail screen displaying a list of e-mails to check. When the user selects an input area corresponding to a desired e-mail from the e-mail screen, the display 361 displays the content of the e-mail.

The receiver 363 is a portion constituting a call receiving section, and outputs a voice of a communicating party in using the voice calling function with the sub-terminal 3 connected to the main terminal 2 and with the sub-terminal 3 separated from the main terminal 2.

The microphone 364 is a portion constituting a call transmitting section, and outputs a voice of a communicating party in using the voice calling function with the sub-terminal 3 separated.

The speaker 365 outputs a voice of a communicating party when the videophone function is used with the sub-terminal 3 connected to the main terminal 2. Further, the speaker 365 outputs speech data of one-segment broadcasting when the One Seg function is used irrespective of the state of the sub-terminal 3 (in other words, irrespective of whether the sub-terminal 3 is in the connected state or separate state).

The sub-camera 366 is used as an image pickup device to shoot a face image of the user when the videophone function is used. In addition, this sub-camera 366 may be used in the camera function.

The party-terminal battery charging apparatus 367 functions as a charging section, and performs charge operation to charge the party-terminal i.e. the battery section 26 of the main terminal 2 described later. For example, as in the party-terminal battery charging apparatus 276 on the main terminal 2 side, the party-terminal battery charging apparatus 367 performs the charge operation on the battery section 26 of the main terminal 2 connected to the sub-terminal 3 via a contact terminal, not shown, using the remaining battery remaining of the battery section 35. In addition, charging the battery section 26 of the main terminal 2 is not limited to such a case of performing via the contact terminal, but may be performed in a non-contact aspect. The control section 31 controls these components. Particularly, the control section 31 determines the operation of each device installed in the sub-terminal 3 according to descriptions of the display operation table, charge operation table and sub-terminal device operation table held in the table holding section 34 based on the battery remaining amount of the battery section 35 of the sub-terminal 3 and the battery remaining amount of the battery section 26 of the main terminal 2. Further, as in the control section 21 on the main terminal 2 side, the control section 31 functions as a battery remaining amount detecting section that detects the battery remaining amount of the battery section 35 of the sub-terminal 3.

Described herein are descriptions of the display operation table and charge operation table held in the table holding section 25 of the main terminal 2 that the cellular telephone 1 according to this embodiment has, and descriptions of the display operation table and charge operation table held in the table holding section 34 of the sub-terminal 3. FIGS. 4 and 5 are diagrams to respectively explain descriptions of the display operation table and charge operation table held in the table holding section 25 of the main terminal 2 that the cellular telephone 1 according to this embodiment has. In addition, in this embodiment, the table holding section 34 of the sub-terminal 3 holds the same display operation table and charge operation table as those in the table holding section 25 of the main terminal 2. Moreover, the descriptions registered with the display operation table and charge operation table as shown in FIGS. 4 and 5 are indicated as an example, and the invention is not limited thereto.

As shown in FIG. 4, with the display operation table are registered descriptions (display contents of a battery icon) displayed in the display 361 (partially, sub-display 275) corresponding to a combination of the battery remaining amount of the battery section 26 of the main terminal 2 and the battery remaining amount of the battery section 35 of the sub-terminal 3. In the display operation table as shown in FIG. 4, the battery remaining amounts in the battery section 26 of the main terminal 2 and the battery section 35 of the sub-terminal 3 are classified into five-step battery remaining amount status conditions (battery remaining amount (large), battery remaining amount (middle), battery remaining amount (small), low voltage state, power off state) and registered, and the display content corresponding to each status condition is registered.

In the display operation table, it is registered that display is performed in normal display form (normal display) when the battery remaining amounts in the battery section 26 of the main terminal 2 and the battery section 35 of the sub-terminal 3 are of battery remaining amount (large), battery remaining amount (middle) and battery remaining amount (small). Therefore, in these cases, the display 361 performs the display operation in normal display form of the battery remaining amount. For example, when each of the battery remaining amounts in the battery section 35 of the sub-terminal 3 and the battery section 26 of the main terminal 2 is of battery remaining amount (large), as shown in FIG. 6(a), three remaining-amount marks are displayed in each of a battery icon (hereinafter, referred to as a "sub-terminal battery icon") 61 corresponding to the sub-terminal 3 and a battery icon (hereinafter, referred to as a "main-terminal battery icon") 62 corresponding to the main terminal 2. Further, when the battery remaining amounts in the battery section 35 of the sub-terminal 3 and the battery section 26 of the main terminal 2 are respectively of battery remaining amount (large) and battery remaining amount (small), as shown in FIG. 6(b), three remaining-amount marks are displayed in the sub-terminal battery icon 61, while a single remaining-amount mark is displayed in the main-terminal battery icon 62.

Further, it is registered that display is performed in display form corresponding to the low voltage state in one or both of the sub-terminal battery icon and main-terminal battery icon (display of low voltage), when one or both of the battery remaining amounts in the battery section 26 of the main terminal 2 and the battery section 35 of the sub-terminal 3 are in the low voltage state. Therefore, in these cases, in the display 361, the display operation in display form corresponding to the low voltage state is performed in one or both of the sub-terminal battery icon and main-terminal battery icon. For example, when the battery remaining amounts in the battery section 35 of the sub-terminal 3 and the battery section 26 of the main terminal 2 are respectively of battery remaining amount (large) and low voltage state, as shown in FIG. 6(c), three remaining-amount marks are displayed in the sub-terminal battery icon 61, while a single remaining-amount mark (remaining-amount mark with a blank inside) corresponding to the low voltage state is displayed in the main-terminal battery icon 62. In addition, when the low voltage state is continued, the state changes to the power off state. In the cellular telephone 1 according to this embodiment, by defining the display content (battery icon indicative of the low voltage state) for informing of the low voltage state before changing to the power off state in the display operation table, it is possible to urge the user to perform processing such as charge operation and the like on the corresponding apparatus (main terminal 2 or sub-terminal 3).

Figure 6:
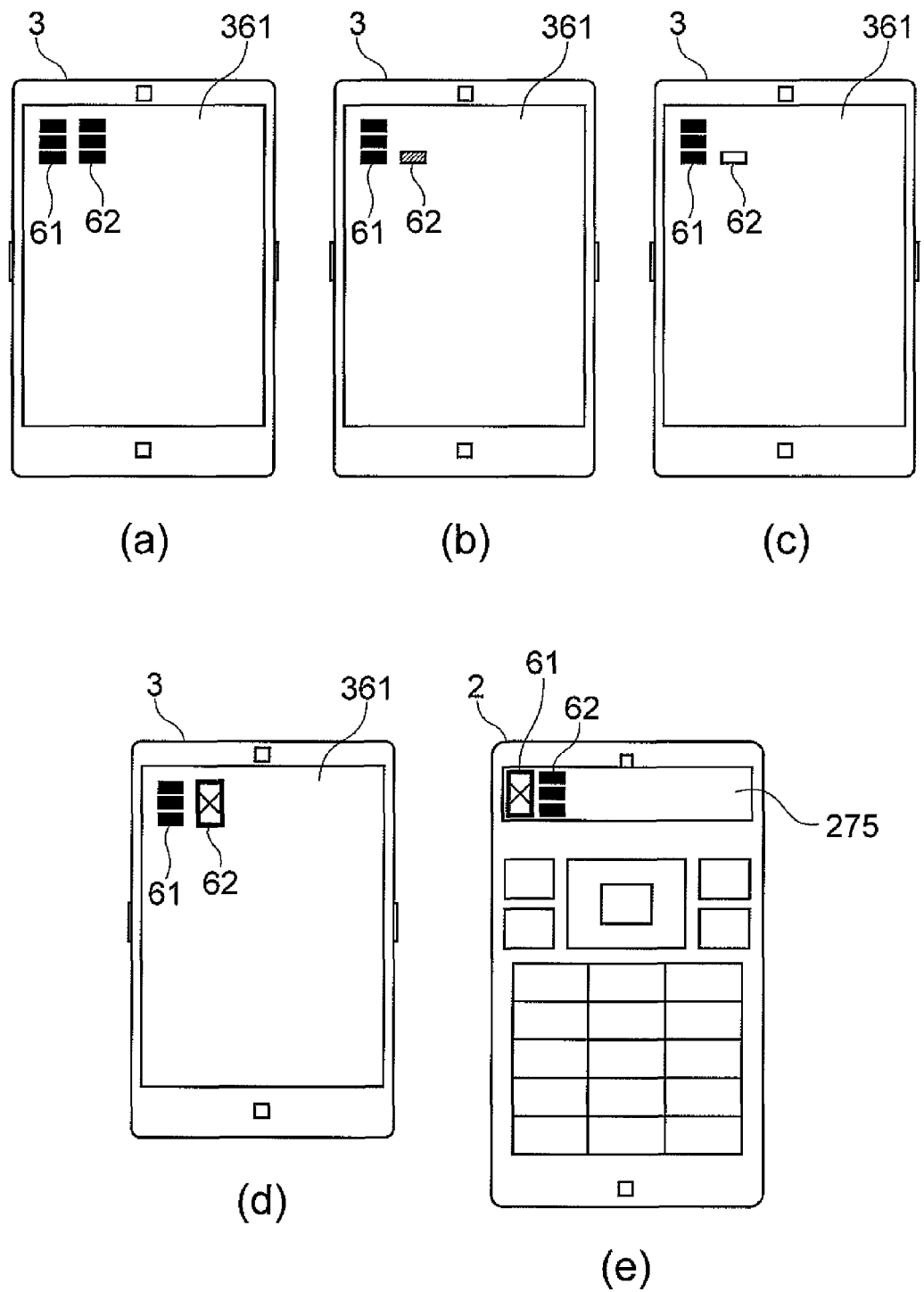
FIG. 6 contains diagrams showing examples of a battery icon displayed in a display, etc. of the cellular telephone.

Furthermore, it is registered that display in display form corresponding to the power off state is performed in either the display 361 or sub-display 275 (display of off state) when either the main terminal 2 or the sub-terminal 3 is in the power off state. Therefore, the display operation is performed in display form corresponding to the power off state in either the display 361 or the sub-display 275. For example, when the battery remaining amount of the battery section 35 of the sub-terminal 3 is of battery remaining amount (large) while the main terminal 2 is in the power off state, as shown in FIG. 6(d), three remaining-amount marks are displayed in the sub-terminal battery icon 61 while a power off icon is displayed in the main battery icon 62. Meanwhile, when the sub-terminal 3 is in the power off state while the battery remaining amount of the battery section 26 of the main terminal 2 is of battery remaining amount (large), as shown in FIG. 6(*e*), in the sub-display 275, three remaining-amount marks are displayed in the main-terminal battery icon 62, while the power off icon is displayed in the sub-terminal battery icon 61.

Meanwhile, as shown in FIG. 5, with the charge operation table is registered the presence or absence of the charge operation from the main terminal 2 to the sub-terminal 3 or charge operation from the sub-terminal 3 to the main terminal 2 corresponding to a combination of the battery remaining amount of the battery section 26 of the main terminal 2 and the battery remaining amount of the battery section 35 of the sub-terminal 3. In the charge operation table as shown in FIG. 5, as in the display operation table, the battery remaining amounts in the battery section 26 of the main terminal 2 and the battery section 35 of the sub-terminal 3 are classified into five-step battery remaining amount status conditions (battery remaining amount (large), battery remaining amount (middle), battery remaining amount (small), low voltage state, power off state) and registered, and the presence or absence of the charge operation corresponding to each status condition is registered.

It is registered that the charge operation is not performed when each of the battery remaining amounts in the battery section 26 of the main terminal 2 and the battery section 35 of the sub-terminal 3 is of battery remaining amount (large) and battery remaining amount (middle) (no charge operation). Further, It is registered that the charge operation is not performed when each of the battery remaining amounts in the battery section 26 of the main terminal 2 and the battery section 35 of the sub-terminal 3 is of battery remaining amount (small), low voltage state and power off state (no charge operation). Therefore, in these cases, neither the main terminal 2 nor the sub-terminal 3 performs the charge operation on the sub-terminal 3 or the main terminal 2, respectively.

Figure 7:
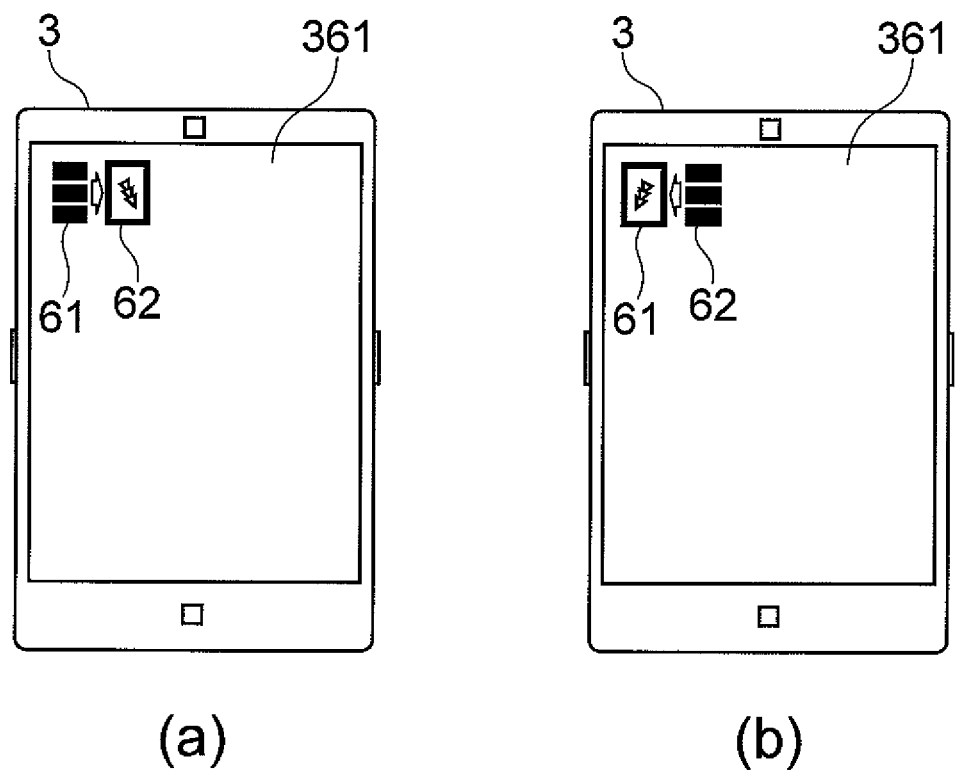
FIG. 7 contains diagrams showing examples of the battery icon displayed in the display, etc. of the cellular telephone.

Further, it is registered that the sub-terminal 3 performs the charge operation on the main terminal 2 (start charging from the sub-terminal to the main terminal) when the battery remaining amount of the battery section 35 of the sub-terminal 3 is of battery remaining amount (large) or battery remaining amount (middle) while the battery remaining amount of the battery section 26 of the main terminal 2 is of battery remaining amount (small) or low voltage state, or the main terminal 2 is in the power off state. Therefore, in these cases, the party-terminal battery charging apparatus 367 of the sub-terminal 3 performs the charge operation on the battery section 26 of the main terminal 2. In addition, when the sub-terminal 3 thus performs the charge operation on the main terminal 2, as shown in FIG. 7(*a*), the display 361 displays the display content corresponding to the charge operation from the sub-terminal battery icon 61 to the main-terminal battery icon 62.

Meanwhile, it is registered that the main terminal 2 performs the charge operation on the sub-terminal 3 (start charging from the main terminal to the sub-terminal) when the battery remaining amount of the battery section 26 of the main terminal 2 is of battery remaining amount (large) or battery remaining amount (middle) while the battery remaining amount of the battery section 35 of the sub-terminal 3 is of battery remaining amount (small) or low voltage state, or the sub-terminal 3 is in the power off state. Therefore, in these cases, the party-terminal battery charging apparatus 276 of the main terminal 2 performs the charge operation on the battery section 35 of the sub-terminal 3. In addition, when the main terminal 2 thus performs the charge operation on the sub-terminal 3, as shown in FIG. 7(*b*), the display 361 displays the display content corresponding to the charge operation from the main-terminal battery icon 62 to the sub-terminal battery icon 61.

Described next are descriptions of the main-terminal device operation table held in the table holding section 25 of the main terminal 2 of the cellular telephone 1 according to this embodiment. FIG. 8 is a diagram to explain the descriptions registered with the main-terminal device operation table held in the table holding section 25 of the main terminal 2 that the cellular telephone 1 according to this embodiment has. With the main-terminal device operation table shown in FIG. 8 is registered information to control operations of devices of the main terminal 2 when the main terminal 2 has the battery remaining amount of the battery remaining amount status condition (small) or more while the sub-terminal 3 is in the power off state. In addition, the functions and devices of the main terminal 2 managed in the main-terminal device operation table as shown in FIG. 8 are indicated as an example, and the invention is not limited thereto. For example, it is possible to register any functions and devices that are functions and devices which the main terminal 2 has and that need to be controlled corresponding to the power off state of the sub-terminal 3. Herein, the case that the sub-terminal 3 is in the power off state is described, but the case that the sub-terminal 3 is in the low voltage state may be included.

As shown in FIG. 8, operating states of devices that the main terminal 2 has are registered with the main-terminal device operation table corresponding to functions (hereinafter, referred to as "operating functions") that operate in the cellular telephone 1. More specifically, the operating states of the "sub-display", "operating key", "receiver" and "microphone" are registered when the operating functions of the cellular telephone 1 are "voice calling function", "e-mail processing function", "videophone function", and "I-mode (Registered Trademark) transmit function".

As shown in FIG. 8, it is registered to drive devices (sub-display 275, operating key 271, receiver 272 and microphone 273) enabling the voice calling function to be used by the main terminal 2 alone when the operating function of the cellular telephone 1 is the voice calling function and the sub-terminal 3 is in the power off state. In addition, it is registered that the sub-display 275 displays a calling number when the calling function in the voice calling function is the operating function, and that the sub-display 275 displays an incoming-call number when the call receiving function is the operating function.

Further, it is registered to drive devices (sub-display 275 and operating key 271) for informing that the e-mail processing function cannot be used by the main terminal 2 alone when the operating function of the cellular telephone 1 is the e-mail processing function and the sub-terminal 3 is in the power off state. In this case, the receiver 272 and microphone 273 are not driven. Moreover, it is registered that the sub-display 275 displays a message indicating that e-mail transmission is not allowed when the e-mail transmission function in the e-mail processing function is designated as the operating function (i.e. when the mailer installed in the cellular telephone 1 is started), and that the sub-display 275 displays the number of received e-mails when the e-mail receiving function is designated as the operating function (i.e. when an e-mail is received from the base station). In addition, described herein is the case of registering the information in response to the aspect that the e-mail processing function cannot be used by the main terminal 2 alone, but information may be registered in response to an aspect that the e-mail processing function can be used by the main terminal 2 alone. In this case, it is considered that the sub-display 275 displays a transmission-targeted e-mail to enable edits or the like to be performed, while displaying a received e-mail.

Furthermore, it is registered to drive devices (sub-display 275 and operating key 271) for informing that the videophone function cannot be used by the main terminal 2 alone when the operating function of the cellular telephone 1 is the videophone function and the sub-terminal 3 is in the power off state. In this case, the receiver 272 and microphone 273 are not driven. In addition, it is registered that the sub-display 275 displays a message indicating that the videophone function cannot be used in both of the cases that the calling function in the videophone function is designated as the operating function and that the call receiving function in the videophone function is designated as the operating function.

Still furthermore, it is registered to drive devices (sub-display 275 and operating key 271) for informing that the i-mode transmit function cannot be used by the main terminal 2 alone when the operating function of the cellular telephone 1 is the i-mode transmit function and the sub-terminal 3 is in the power off state. In this case, the receiver 272 and microphone 273 are not driven. In addition, it is registered that the sub-display 275 displays a message indicating that the i-mode transmit function cannot be used when the i-mode transmit function is designated as the operating function.

Described next are descriptions of the sub-terminal device operation table held in the table holding section 34 of the sub-terminal 3 of the cellular telephone 1 according to this embodiment. FIG. 9 is a diagram to explain the descriptions registered with the sub-terminal device operation table held in the table holding section 34 of the sub-terminal 3 that the cellular telephone 1 according to this embodiment has. With the sub-terminal device operation table shown in FIG. 9 is registered information to control operations of devices of the sub-terminal 3 when the sub-terminal 3 has the battery remaining amount of the battery remaining amount status condition (small) or more while the main terminal 2 is in the power off state. In addition, the functions and devices of the sub-terminal 3 managed in the sub-terminal device operation table as shown in FIG. 9 are indicated as an example, and the invention is not limited thereto. For example, it is possible to register any functions and devices that are functions and devices which the sub-terminal 3 has and that need to be controlled corresponding to the power off state of the main terminal 2. Herein, the case that the main terminal 2 is in the power off state is described, but the case that the main terminal 2 is in the low voltage state may be included.

As shown in FIG. 9, operating states of devices that the sub-terminal 3 has are registered with the sub-terminal device operation table corresponding to the functions (operating functions) that operate in the cellular telephone 1, as in the main-terminal device operation table. More specifically, the operating states of the "main display", "touch panel", "receiver" and "microphone" are registered when the operating functions of the cellular telephone 1 are "voice calling function", "e-mail processing function", "videophone function", and "i-mode transmit function".

As shown in FIG. 9, it is registered to drive devices (main display 361 and touch panel 362) for informing that the voice calling function cannot be used by the sub-terminal 3 alone when the operating function of the cellular telephone 1 is the voice calling function and the main terminal 2 is in the power off state. In this case, the receiver 363 and microphone 364 are not driven. Moreover, it is registered that the main display 361 displays a massage indicating that the voice calling function cannot be used because the main terminal 2 in the power off state. In addition, when the main terminal 2 is in the power off state, since any voice call is not received, the call receiving function in the voice calling function is not designated as the operating function.

Further, it is registered to drive devices (main display 361 and touch panel 362) for informing that the e-main processing function cannot be used by the sub-terminal 3 alone when the operating function of the cellular telephone 1 is the e-mail processing function and the main terminal 2 is in the power off state. In this case, the receiver 363 and microphone 364 are not driven. Moreover, it is registered that the main display 361 displays a message indicating that the e-mail processing function cannot be used due to the power off state of the main terminal 2 when the e-mail transmission function in the e-mail processing function is the operating function. In addition, when the main terminal 2 is in the power off state, since any e-mail is not received, the e-mail receiving function in the e-mail processing function is not designated as the operating function.

Furthermore, it is registered to drive devices (main display 361 and touch panel 362) for informing that the videophone function cannot be used by the sub-terminal 3 alone when the operating function of the cellular telephone 1 is the videophone function and the main terminal 2 is in the power off state. In this case, the receiver 363 and microphone 364 are not driven. Moreover, it is registered that the main display 361 displays a message indicating that the videophone function cannot be used due to the power off state of the main terminal 2 when the calling function in the videophone function is the operating function. In addition, when the main terminal 2 is in the power off state, since any videophone call is not received, the call receiving function in the videophone function is not designated as the operating function.

Still furthermore, it is registered to drive devices (main display 361 and touch panel 362) for informing that the i-mode transmit function cannot be used by the sub-terminal 3 alone when the operating function of the cellular telephone 1 is the i-mode transmit function and the main terminal 2 is in the power off state. In this case, the receiver 363 and microphone 364 are not driven. Moreover, it is registered that the main display 361 displays a message indicating that the i-mode transmit function cannot be used due to the power off state of the main terminal 2 when the i-mode transmit function is the operating function.

In addition, in the main-terminal device operation table and sub-terminal device operation table as shown in FIGS. 8 and 9, operating states of the devices in the operating functions are registered based on the assumption that the sub-terminal 3 or main terminal 2 is in the power off state (low voltage state), but it is also assumed that the sub-terminal 3 or main terminal 2 is changed to the power off state (low voltage state) during the execution of an operating function. In this case, it is preferable that the devices of the main terminal 2 and sub-terminal 3 driven in each operating function inform the user of the power off state, and that devices are controlled according to the registered descriptions as shown in FIGS. 8 and 9. In this case, it is possible to avoid a situation that the function being executed currently is suspended due to sudden transition to the power off state of the main terminal 2 or sub-terminal 3, and to ensure the stable operation in the cellular telephone 1.

For example, when the sub-terminal 3 changes to the power off state (low voltage state) while the voice calling function is used with the sub-terminal 3 connected to the main terminal 2, it is preferable that the display 361 displays that the receiver 363 on the sub-terminal 3 side is switched to the receiver 272 on the main terminal 2 side due to transition to the power off state (low voltage state) of the sub-terminal 3. Further, when the sub-terminal 3 changes to the power off state (low voltage state) while the videophone function is used with the sub-terminal 3 connected to the main terminal 2, it is preferable that the display 361 displays that videophone function is switched to the voice calling function due to transition to the power off state (low voltage state) of the sub-terminal 3. Furthermore, when the sub-terminal 3 changes to the power off state (low voltage state) while the i-mode transmit function is used with the sub-terminal 3 connected to the main terminal 2, it is preferable that the display 361 displays that the i-mode transmit is finished due to transition to the power off state (low voltage state) of the sub-terminal 3.

Meanwhile, when the main terminal 2 changes to the power off state (low voltage state) while the voice calling function is used with the sub-terminal 3 connected to the main terminal 2, it is preferable that the display 361 displays that the voice calling function is finished due to transition to the power off state (low voltage state) of the main terminal 2. Further, when the main terminal 2 changes to the power off state (low voltage state) while the videophone function is used with the sub-terminal 3 connected to the main terminal 2, it is preferable that the display 361 displays that the videophone function is finished due to transition to the power off state (low voltage state) of the main terminal 2. Furthermore, when the main terminal 2 changes to the power off state (low voltage state) while the i-mode transmit function is used with the sub-terminal 3 connected to the main terminal 2, it is preferable that the display 361 displays that the i-mode transmit is finished due to transition to the power off state (low voltage state) of the main terminal 2.

Figure 10:
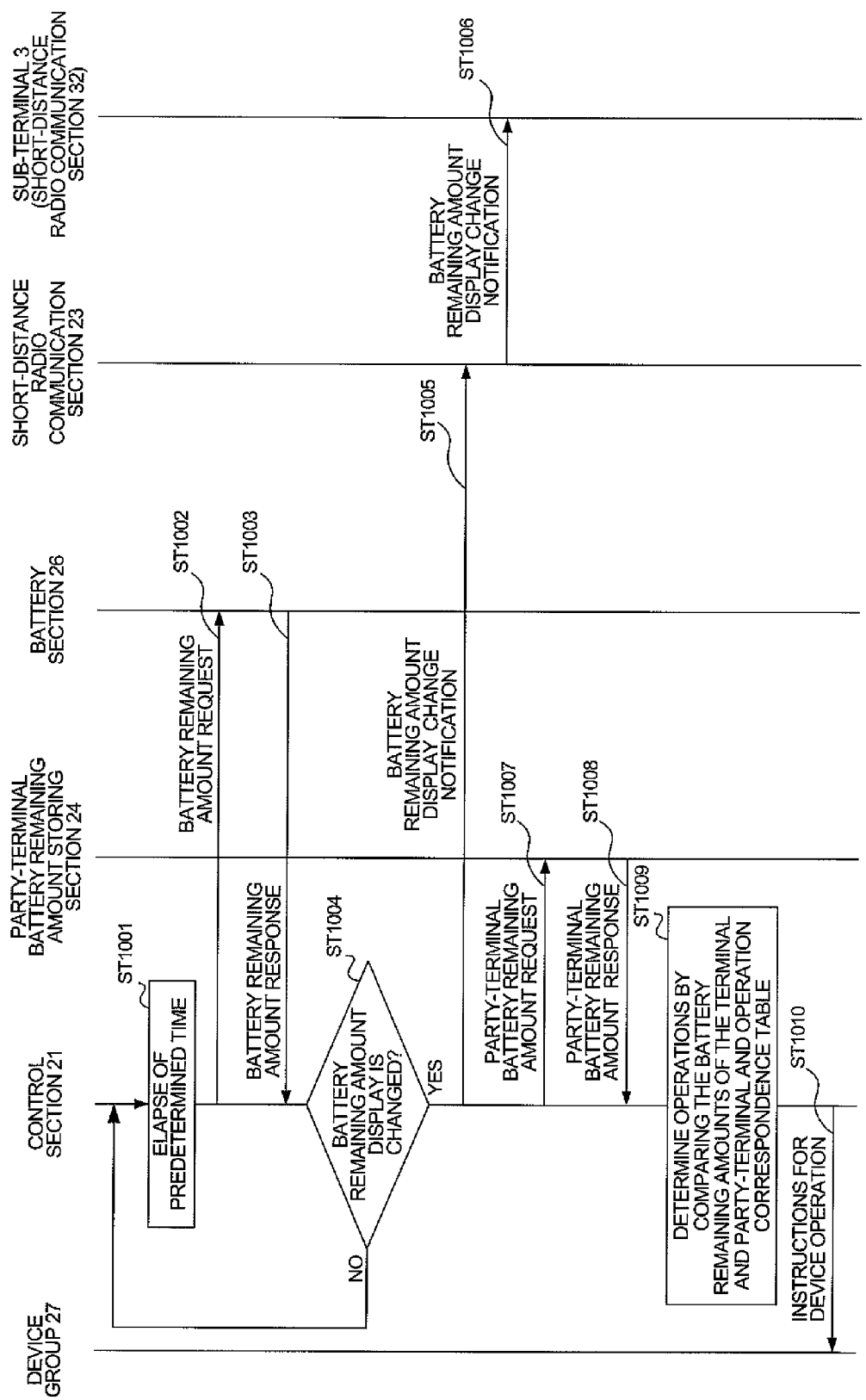
FIG. 10 is a sequence diagram to explain operations when the main terminal in the cellular telephone controls operations of predetermined devices after notifying the sub-terminal of a battery remaining amount.
Figure 11:
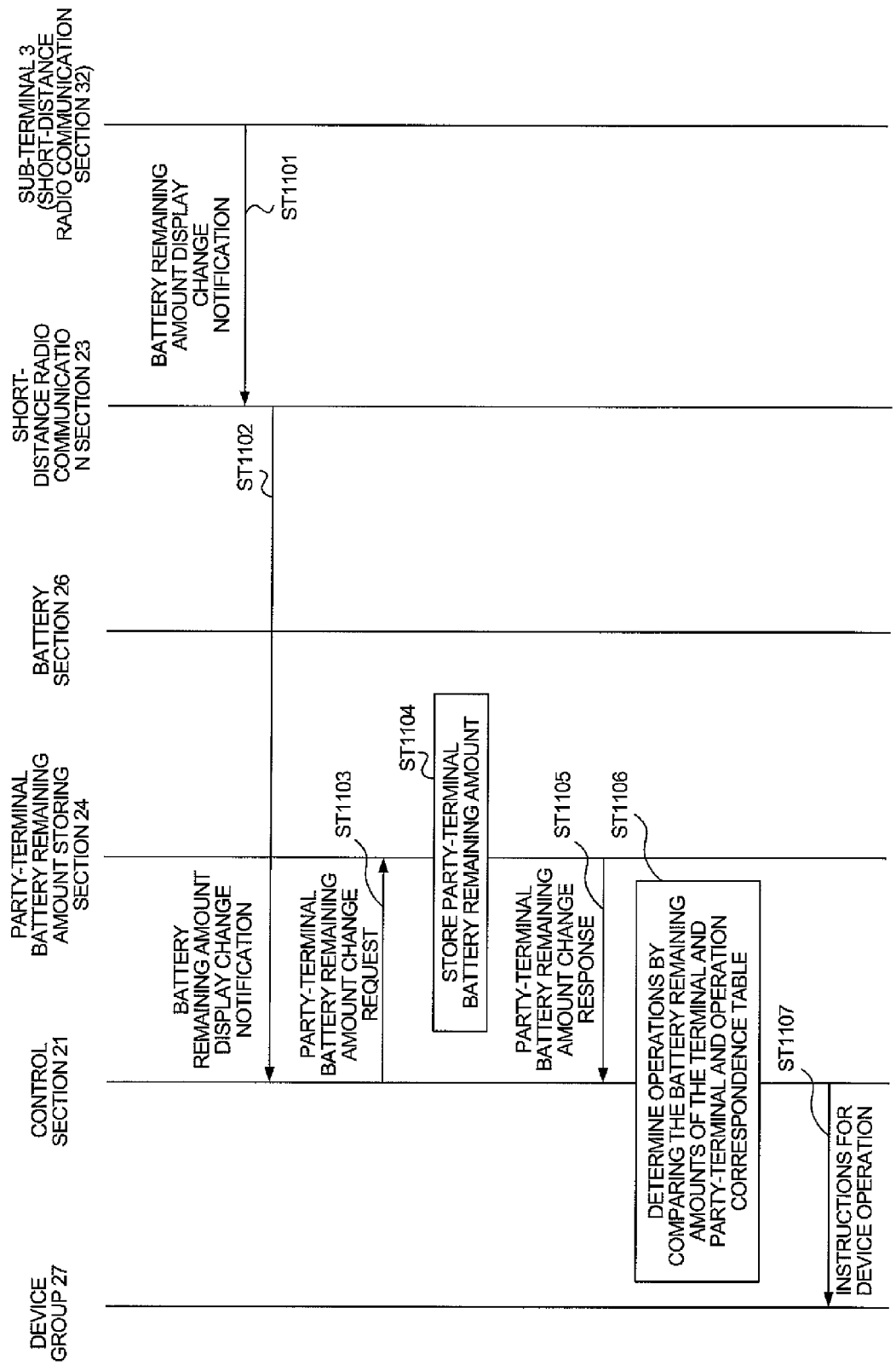
FIG. 11 is a sequence diagram to explain operations when the main terminal in the cellular telephone controls operations of predetermined devices after being notified of a battery remaining amount from the sub-terminal.

Described next are operations of the cellular telephone 1 with such a configuration. The following are descriptions of the operation when the main terminal 2 that the cellular telephone 1 has controls operations of predetermined devices after notifying the sub-terminal 3 of the battery remaining amount, and of the operation when the main terminal 2 that the cellular telephone 1 has controls operations of predetermined devices after being notified of the battery remaining amount from the sub-terminal 3. FIG. 10 is a sequence diagram to explain operations when the main terminal 2 that the cellular telephone 1 according to this embodiment has controls operations of predetermined devices after notifying the sub-terminal 3 of the battery remaining amount. FIG. 11 is a sequence diagram to explain operations when the main terminal 2 that the cellular telephone 1 according to this embodiment has controls operations of predetermined devices after being notified of the battery remaining amount from the sub-terminal 3. In addition, herein, the main terminal 2 is mainly described, but the sub-terminal 3 performs similar operations.

As shown in FIG. 10, the control section 21 monitors a lapse of predetermined time (step ST1001), and when the section 21 detects a lapse of predetermined time, requests a battery remaining amount to the battery section 26 (step ST1002: battery remaining amount request). Upon receiving the battery remaining amount request, the battery section 26 sends the battery remaining amount to the control section 21 (step ST1003: battery remaining amount response). Then, upon receiving the battery remaining amount response, the control section 21 determines whether or not to change display of the battery remaining amount in the display 361 of the sub-terminal 3 (step ST1004). More specifically, it is determined whether or not the battery remaining amount in the battery section 26 is changed. In other words, the control section 21 functions as a battery remaining amount detecting section that detects the battery remaining amount in the battery section 26. Herein, when the battery remaining amount status condition in the battery section 26 is not changed, the processing returns to step ST1001, and the processing of ST1001 and subsequent steps is repeated.

Meanwhile, when the battery remaining amount in the battery section 26 is changed, the control section 21 outputs battery remaining amount display change notification for notifying of changing display of the battery remaining amount to the short-distance radio communication section 23 (ST1005). The battery remaining amount display change notification includes the changed battery remaining amount status condition. Upon receiving the battery remaining amount display change notification, the short-distance radio communication section 23 outputs the battery remaining amount display change notification to the sub-terminal 3 (short-distance radio communication section 32) (step ST1006).

After outputting the battery remaining amount display change notification to the short-distance radio communication section 23, the control section 21 requests a party-terminal battery remaining amount to the party-terminal battery remaining amount storing section 24 (step ST1007: party-terminal battery remaining amount request). Upon receiving the party-terminal battery remaining amount request, the party-terminal battery remaining amount storing section 24 sends the party-terminal battery remaining amount to the control section 21 (step ST1008: party-terminal battery remaining amount response). In addition, it is assumed that the party-terminal battery remaining amount storing section 24 is always notified of a new battery remaining amount from the sub-terminal 3 side to store.

Upon receiving the party-terminal battery remaining amount response, the control section 21 determines the operation of each device (step ST1009) according to battery remaining amount status conditions of the main terminal 2 and sub-terminal 3, and the registered descriptions in the operation correspondence table (display operation table, charge operation table, and main-terminal device operation table) held in the table holding section 25. Then, the control section 21 instructs the corresponding device to obtain a predetermined operating state designated in the operation table (ST1010). Thus, the operation is finished when the main terminal 2 controls the operation of a predetermined device after notifying the sub-terminal 3 of the battery remaining amount.

For example, as a specific example of instructions for an operating state based on the charge operation table, when the battery remaining amount status condition of the main terminal 2 is of battery remaining amount (large) while the battery remaining amount status condition of the sub-terminal 3 is of battery remaining amount (small), the control section 21 instructs the party-terminal battery charging apparatus 276 to perform the charge operation. Thus, in the cellular telephone 1 according to this embodiment, since the presence or absence of the charge operation is determined based on the battery remaining amounts of the main terminal 2 and sub-terminal 3 and the descriptions of the charge operation table, for example, when the battery remaining amount is small in the sub-terminal 3, it is made possible that the main terminal 2 charges the battery section 35 of the sub-terminal 3 suitably.

Meanwhile, as shown in FIG. 11, when the sub-terminal 3 detects that the battery remaining amount status condition is changed in the same manner as in the main terminal 2 shown in FIG. 10, the sub-terminal 3 outputs the battery remaining amount display change notification to the main terminal 2 (step ST1101). The battery remaining amount display change notification includes information indicative of the changed battery remaining amount status condition of the sub-terminal 3. Upon receiving the battery remaining amount display change notification, the short-distance radio communication section 23 outputs the battery remaining amount display change notification to the control section 21 (step ST1102). Upon receiving the battery remaining amount display change notification, the control section 21 requests the party-terminal battery remaining amount storing section 24 to change the battery remaining amount status condition of the sub-terminal 3 included in the notification (step ST1103: party-terminal battery remaining amount change request).

Upon receiving the party-terminal battery remaining amount change request, the party-terminal battery remaining amount storing section 24 stores the battery remaining amount status condition (party-terminal battery remaining amount) of the sub-terminal 3 included in the notification (step ST1104). By this means, the battery remaining amount status condition of the sub-terminal 3 stored in the party-terminal battery remaining amount storing section 24 is updated. Then, the party-terminal battery remaining amount storing section 24 outputs to the control section 21 a response (party-terminal battery remaining amount change response) indicating that the battery remaining amount status condition (party-terminal battery remaining amount) of the sub-terminal 3 is changed (step ST1105).

Upon receiving the party-terminal battery remaining amount change response, the control section 21 determines the operation of each device (step ST1106) according to the battery remaining amount of the main terminal 2 that is requested to the battery section 26 and sent, the battery remaining amount status condition of the sub-terminal 3 stored in the party-terminal battery remaining amount storing section 24, and the registered descriptions in the operation correspondence table (display operation table, charge operation table, and main-terminal device operation table) held in the table holding section 25. Then, the control section 21 instructs the corresponding device to obtain a predetermined operating state designated in the operation table (ST1107). Thus, the operation is finished when the main terminal 2 controls the operation of a predetermined device after being notified of the battery remaining amount from the sub-terminal 3.

For example, as a specific example of instructions for an operating state based on the display operation table, when the battery remaining amount status condition of the main terminal 2 is of battery remaining amount (large) while the battery remaining amount status condition of the sub-terminal 3 is of low voltage state, the control section 21 instructs the display 361 to perform the operation of display indicative of the sub-terminal 3 being in the low voltage state via the control section 31 on the sub-terminal 3 side. Thus, according to the cellular telephone 1 according to this embodiment, when a change in the battery remaining amount is detected in at least one of the main terminal 2 and sub-terminal 3, the battery remaining amounts of the main terminal 2 and sub-terminal 3 displayed in the display 361 and the like are determined corresponding to the battery remaining amounts of the main terminal 2 and sub-terminal 3 and the descriptions of the display operation table, it is thus possible to always display latest battery remaining amounts of the main terminal 2 and sub-terminal 3 in the display 361, and therefore, the user can be informed of the latest battery remaining amount status condition in each apparatus.

Figure 12:
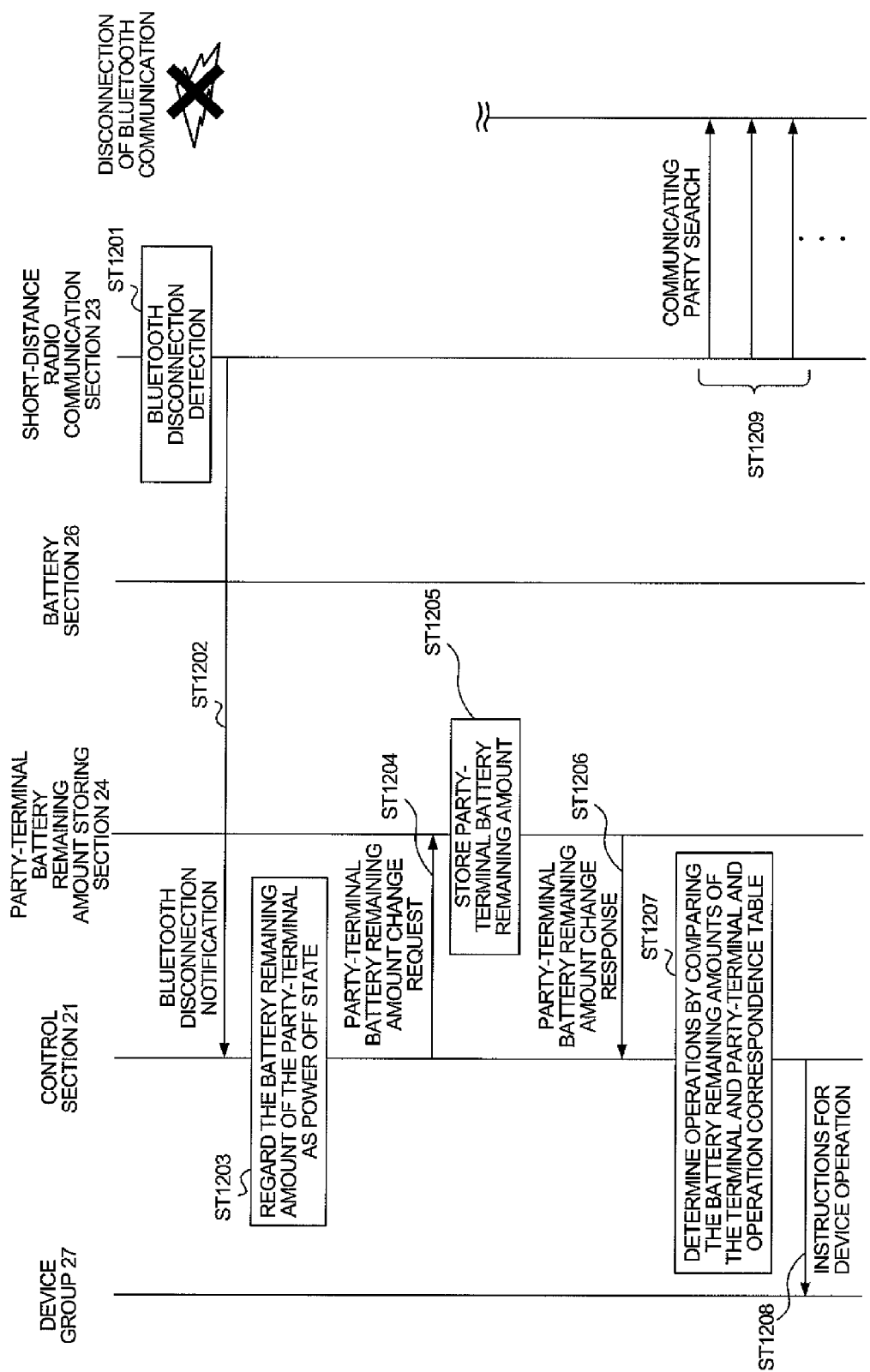
FIG. 12 is a sequence diagram to explain operations when the power is turned off in either the main terminal or the sub-terminal in the cellular telephone.

When either the main terminal 2 or the sub-terminal 3 is in the power off state, the main terminal 2 or the sub-terminal 3 does not output the battery remaining amount display change notification. Therefore, in the cellular telephone 1 according to this embodiment, it is configured that the processing proceeds while treating disconnection detection in Bluetooth communication as the power off state of the corresponding terminal. Described below is the operation of the cellular telephone 1 when either the main terminal 2 or the sub-terminal 3 is thus in the power off state. FIG. 12 is a sequence diagram to explain operations when either the main terminal 2 or the sub-terminal 3, which the cellular telephone 1 according to this embodiment has, in the power off state. In addition, FIG. 12 shows an example of the operation of the main terminal 2 when the sub-terminal 3 is in the power off state, and in a similar manner, the processing is performed for the operation of the sub-terminal 3 when the main terminal 2 is in the power off state.

As shown in FIG. 12, when the sub-terminal 3 is in the power off state, the short-distance radio communication section 23 detects disconnection of Bluetooth communication based on a non-response to a communicating-party search executed in Bluetooth communication (step ST1201). When detecting the disconnection of Bluetooth communication, the short-distance radio communication section 23 notifies the control section 21 of the disconnection of Bluetooth communication (step ST1202: Bluetooth disconnection notification). Upon receiving the Bluetooth disconnection notification, the control section 21 recognizes that the battery remaining amount status condition of the sub-terminal 3 is the power off state (step ST1203). When recognizing the power off state of the sub-terminal 3, the control section 21 requests the party-terminal battery remaining amount storing section 24 to change the battery remaining amount status condition of the sub-terminal 3 (step ST1204: party-terminal battery remaining amount change request). In addition, this party-terminal battery remaining amount change request includes the battery remaining amount status condition of the sub-terminal 3 (herein, power off state).

Upon receiving the party-terminal battery remaining amount change request, the party-terminal battery remaining amount storing section 24 stores the battery remaining amount status condition (herein, power off state) of the sub-terminal 3 included in the notification (step ST1205). By this means, the battery remaining amount status condition of the sub-terminal 3 stored in the party-terminal battery remaining amount storing section 24 is updated. Then, the party-terminal battery remaining amount storing section 24 outputs to the control section 21 a response (party-terminal battery remaining amount change response) indicating that the battery remaining amount status condition of the sub-terminal 3 is changed (step ST1206).

Upon receiving the party-terminal battery remaining amount change response, the control section 21 determines the operation of each device (step ST1207) according to the battery remaining amount of the main terminal 2 that is requested to the battery section 26 and sent, the battery remaining amount status condition (power off state) of the sub-terminal 3 stored in the party-terminal battery remaining amount storing section 24, and the registered descriptions in the operation correspondence table (display operation table, charge operation table, and main-terminal device operation table) held in the table holding section 25. Then, the control section 21 instructs the corresponding device to obtain a predetermined operating state designated in the operation table (step ST1208). Thus, the operation is finished when either the main terminal 2 or the sub-terminal 3 is in the power off state.

For example, as a specific example of instructions for an operating state based on the main-terminal device operation table, when the battery remaining amount status condition of the main terminal 2 is of battery remaining amount (large) while the battery remaining amount status condition of the sub-terminal 3 is of power off state, the control section 21 switches the driving of a specific device corresponding to the operating function of the cellular telephone 1. For example, when the operating function is the voice calling function, the control section 21 gives instructions for the receiver 272 on the main terminal 2 side to be driven so that the receiver 272 outputs the voice from the communicating party. Thus, in the cellular telephone 1 according to this embodiment, when it is detected that one of the main terminal 2 and sub-terminal 3 is in the power off state, a device to drive is determined according to the descriptions of the device operation table, and therefore, for example, it is made possible to ensure execution of the function usable in one of the apparatuses, and to inform the user that a specific function cannot be used due to the power off state of one of the apparatuses (main terminal 2 or sub-terminal 3). Particularly, in the cellular telephone 1 according to this embodiment, as shown in FIGS. 8 and 9, the device operation table defines devices to drive corresponding to the functions operating in the main terminal 2 or sub-terminal 3, it is possible to select a device to drive corresponding to the function operating in the main terminal 2 or sub-terminal 3, and it is thus possible to suitably drive the required device in accordance with the corresponding function.

In addition, in the process during which such operations are performed, in the case of receiving the battery remaining amount display change notification from the sub-terminal 3 side by communicating party search of Bluetooth communication executed by the short-distance radio communication section 23 (step ST1209), the processing is performed according to the sequence explained in FIG. 11. In the sequence as shown in FIG. 12, since disconnection detection in Bluetooth communication is treated as the power off state of the sub-terminal 3, a case is assumed that the sub-terminal 3 simply goes out of the Bluetooth communication range of the main terminal 2. However, as described above, in the case of receiving the battery remaining amount display change notification from the sub-terminal 3 side by communicating party search, since the processing is resumed according to the sequence explained in FIG. 11, any defect does not occur due to such a treating manner.

As described above, in the cellular telephone 1 according to this embodiment, since operations of devices that the main terminal 2 and sub-terminal 3 have are determined based on the battery remaining amount notified from the party-terminal apparatus, and the operation table (display operation table, charge operation table, and device operation table) held in the table holding section 25 (table holding section 34), even when the cellular telephone 1 has a separable structure, it is possible to select the operations of devices that the main terminal 2 and the sub-terminal 3 have corresponding to the battery remaining amount of the party-terminal apparatus. By this means, for example, when the battery remaining amount is small in one of the apparatuses, since it is made possible that the other apparatus informs of the small remaining amount, and that the other apparatus charges the one of the apparatuses, it is possible to prevent the occurrence of an unforeseen situation for the user such that the function installed in the cellular telephone 1 cannot be used, and it is possible to separate a part of the cellular telephone 1 to use while ensuring the stable operation in the cellular telephone 1.

For example, in the cellular telephone 1 according to this embodiment, the control section 31 on the sub-terminal 3 side determines operations of devices that the sub-terminal 3 has according to the battery remaining amounts of the main terminal 2 and sub-terminal 3 and the descriptions of the operation table held. Therefore, when the battery remaining amount is small in the main terminal 2, since it is made possible that the sub-terminal 3 informs of the small remaining amount, and that the sub-terminal 3 charges the battery section 26 of the main terminal 2, it is possible to prevent the occurrence of an unforeseen situation for the user such that the function installed in the cellular telephone 1 cannot be used, and it is possible to guarantee the stable operation in the cellular telephone 1.

Similarly, in the cellular telephone 1 according to this embodiment, the control section 21 on the main terminal 2 side determines operations of devices that the main terminal 2 has according to the battery remaining amounts of the main terminal 2 and sub-terminal 3 and the descriptions of the operation table held. Therefore, when the battery remaining amount is small in the sub-terminal 3, since it is made possible that the main terminal 2 informs of the small remaining amount, and that main terminal 2 charges the battery section 35 of the sub-terminal 3, it is possible to prevent the occurrence of an unforeseen situation for the user such that the function installed in the cellular telephone 1 cannot be used, and it is possible to guarantee the stable operation in the cellular telephone 1.

The present invention is not limited to the above described embodiment, and is capable of being carried into practice with various modifications thereof. For example, the processing sections and processing procedures are capable of being carried into practice with modifications thereof as appropriate without departing from the scope of the invention. Moreover, the invention is capable of being carried into practice with modifications thereof as appropriate without departing from the scope of the invention.

For example, the above-mentioned embodiment describes the case that both of the main terminal 2 and sub-terminal 3 that the cellular telephone has respectively have the party-terminal battery charging apparatus 276 and party-terminal battery charging apparatus 367, and are provided with the function of charging the party-terminal, but the invention is not limited thereto. For example, the invention is applicable to the case that only the main terminal 3 has the function of charging the sub-terminal 3.

Further, in the above-mentioned embodiment, as in the descriptions registered with the charge operation table as shown FIG. 5, corresponding to the battery remaining amounts of the main terminal 2 and sub-terminal 3, the main terminal 2 performs the charge operation on the sub-terminal 3, or the sub-terminal 3 performs the charge operation on the main terminal 2. However, in the cellular telephone 1 with a separable part as in this embodiment, when the charge operation is performed only based on the battery remaining amount status conditions of the main terminal 2 and sub-terminal 3, a case that the charge operation is not performed sufficiently may occur due to the difference in capacity between the battery section 26 and battery section 35, the difference in power consumption between operating functions, and the like. Therefore, it is preferable as an embodiment that a period of time enabling driving (remaining driving time) is calculated from power consumption per unit time in each operating function and the current battery amount, and that the charge operation is controlled corresponding to the remaining driving time. In this case, since it is possible to perform the charge operation corresponding to the remaining driving time, it is possible to perform optimal charge operation that maximizes the remaining driving time.

Further, when the main terminal 2 detects that the battery remaining amount of the sub-terminal 3 is small, power consumption on the sub-terminal 3 side may be reduced by deleting the data amount communicated between the main terminal 2 and sub-terminal 3. For example, when the main terminal 2 and sub-terminal 3 communicate the image data, it is considered to decrease the number of pixels, reduce the number of frames targeted for transmission and the like. In this case, since power consumption of the sub-terminal 3 can be reduced, it is possible to extend the remaining driving time of the sub-terminal 3.

What is claimed is:

1. A cellular telephone apparatus in which a first apparatus constituting a part of the cellular telephone apparatus is provided to be separable from a second apparatus constituting an apparatus body, and each of the first apparatus and the second apparatus is provided with a battery section, comprising:
   a battery remaining amount detecting section that detects a battery remaining amount of each of the first apparatus and the second apparatus;
   a battery remaining amount notifying section that notifies the first apparatus of the battery remaining amount of the second apparatus detected in the battery remaining amount detecting section, and that notifies the second apparatus of the battery remaining amount of the first apparatus detected in the battery remaining amount detecting section;
   a table holding section that holds an operation table that defines operations of devices that the first apparatus and the second apparatus have corresponding to the battery remaining amount of each of the first apparatus and the second apparatus;
   a control section that determines the operations of devices that the first apparatus has based on the battery remaining amount of the second apparatus and the operations of devices that the second apparatus has based on the battery remaining amount of the first apparatus notified in the battery remaining amount notifying section and descriptions of the operation table held in the table holding section; and
   a display section that displays the battery remaining amount of each of the first apparatus and the second apparatus as a device of each of the first apparatus and the second apparatus, respectively,
   wherein the table holding section holds as the operation table a display operation table that defines display contents in the display section corresponding to the battery remaining amount of each of the first apparatus and the second apparatus, and when the battery remaining amount detecting section detects a change in the battery remaining amount of at least one of the first apparatus and the second apparatus, the control section determines the battery remaining amount of each of the first apparatus and the second apparatus to be displayed in the display section corresponding to the battery remaining amount of each of the first apparatus and the second apparatus detected in the battery remaining amount detecting section, the battery remaining amount of each of the first apparatus and the second apparatus notified in the battery remaining amount notifying section, and descriptions of the display operation table.

2. The cellular telephone apparatus according to claim 1, wherein the display operation table defines a display content to inform of imminent battery exhaustion before the battery remaining amount is exhausted in at least one of the first apparatus and the second apparatus and the power is turned off.

3. A cellular telephone system having a first unit installed with part of functions of a cellular telephone apparatus, and a second unit provided with the first unit to be separable with each of the first unit and the second unit provided with a battery section,
   wherein the first unit has a first battery remaining amount detecting section that detects a battery remaining amount of the first unit, a first battery remaining amount notifying section that notifies the second unit of the battery remaining amount detected in the first battery remaining amount detecting section,
   the second unit has a second battery remaining amount detecting section that detects a battery remaining amount of the second unit, a second battery remaining amount notifying section that notifies the first unit of the battery remaining amount detected in the second battery remaining amount detecting section,
   the first unit has a first table holding section that holds a first operation table that defines operations of devices that the first unit has corresponding to the battery remaining amount of each of the first unit and the second unit, and a first control section that determines the operations of devices that the first unit has based on the battery remaining amount of the second unit notified from the second unit and descriptions of the first operation table held in the first table holding section, and
   the second unit has a second table holding section that holds a second operation table that defines operations of devices that the second unit has corresponding to the battery remaining amount of each of the first unit and the second unit, and a second control section that determines the operations of devices that the second unit has based on the battery remaining amount of the first unit notified from the first unit and descriptions of the second operation table held in the second table holding section.

4. The cellular telephone system according to claim 3, wherein the first control section determines the operations of devices that the first unit has according to the battery remaining amount of the first unit detected in the first battery remaining amount detecting section, the battery remaining amount of the second unit notified in the second battery remaining amount notifying section, and the descriptions of the operation table held in the first table holding section.

5. The cellular telephone system according to claim 3, wherein the second control section determines the operations of devices that the second unit has according to the battery remaining amount of the second unit detected in the second battery remaining amount detecting section, the battery remaining amount of the first unit notified in the first battery remaining amount notifying section, and the descriptions of the operation table held in the second table holding section.

6. The cellular telephone system according to claim 3, further comprising:
   a first display section that displays the battery remaining amount of the first unit as a device of the first unit,
   wherein the first table holding section holds as the first operation table a display operation table that defines display contents in the first display section corresponding to the battery remaining amount of each of the first unit and the second unit, and when a change in the battery remaining amount is detected in at least one of the first unit and the second unit, the first control section determines the battery remaining amount of each of the first unit and the second unit to be displayed in the first display section corresponding to the battery remaining amount of the first unit detected in the first battery remaining amount detecting section, the battery remaining amount of the second unit notified in the second battery remaining amount notifying section, and descriptions of the display operation table.

7. The cellular telephone system according to claim 3, further comprising:
a second display section that displays the battery remaining amount of the second unit as a device of the second unit, wherein the second table holding section holds as the second operation table a display operation table that defines display contents in the second display section corresponding to the battery remaining amount of each of the first unit and the second unit, and when a change in the battery remaining amount is detected in at least one of the first unit and the second unit, the second control section determines the battery remaining amount of each of the first unit and the second unit to be displayed in the second display section corresponding to the battery remaining amount of the second unit detected in the second battery remaining amount detecting section, the battery remaining amount of the first unit notified in the first battery remaining amount notifying section, and descriptions of the display operation table.

8. The cellular telephone system according to claim 3, further comprising:
a first charging section that charges the battery section of the second unit as a device of the first unit, wherein the first table holding section holds as the first operation table a charge operation table that defines whether or not the first charging section performs charge operation corresponding to the battery remaining amount of each of the first unit and the second unit, and the first control section determines whether or not the first charging section performs charge operation corresponding to the battery remaining amount of the first unit detected in the first battery remaining amount detecting section, the battery remaining amount of the second unit notified in the second battery remaining amount notifying section, and descriptions of the charge operation table.

9. The cellular telephone system according to claim 3, further comprising:
a second charging section that charges the battery section of the first unit as a device of the second unit, wherein the second table holding section holds as the second operation table a charge operation table that defines whether or not the second charging section performs charge operation corresponding to the battery remaining amount of each of the first unit and the second unit, and the second control section determines whether or not the second charging section performs charge operation corresponding to the battery remaining amount of the second unit detected in the second battery remaining amount detecting section, the battery remaining amount of the first unit notified in the first battery remaining amount notifying section, and descriptions of the charge operation table.

10. The cellular telephone system according to claim 3, wherein the first table holding section holds as the first operation table a device operation table that defines devices to be driven in the first unit when the power is turned off in the second unit and devices to be driven in the second unit when the power is turned off in the first unit, and when it is detected that the power is turned off in one of the first unit and the second unit, the first control section determines a device to be driven corresponding to descriptions of the device operation table.

11. The cellular telephone system according to claim 3, wherein the second table holding section holds as the second operation table a device operation table that defines devices to be driven in the first unit when the power is turned off in the second unit and devices to be driven in the second unit when the power is turned off in the first unit, and when it is detected that the power is turned off in one of the first unit and the second unit, the second control section determines a device to be driven corresponding to descriptions of the device operation table.

* * * * *